United States Patent [19]

Eytcheson et al.

[11] Patent Number: 5,523,620
[45] Date of Patent: Jun. 4, 1996

[54] COPLANAR LINEAR DUAL SWITCH MODULE

[75] Inventors: Charles T. Eytcheson; Todd G. Nakanishi, both of Kokomo; Michael D. Bramel, Summitville; John D. Tagle, West Lafayette; Frank D. Lachenmaier, Kokomo, all of Ind.

[73] Assignee: Delco Electronics Corporation, Kokomo, Ind.

[21] Appl. No.: 195,659

[22] Filed: Feb. 14, 1994

[51] Int. Cl.⁶ .............................. H01L 23/48; H01L 23/52
[52] U.S. Cl. .................... 257/690; 257/692; 257/341; 257/723
[58] Field of Search ................................. 257/723, 724, 257/776, 341, 331, 690, 692

[56] References Cited

U.S. PATENT DOCUMENTS

| | | | |
|---|---|---|---|
| 4,907,068 | 3/1990 | Amann et al. | 257/724 |
| 5,172,215 | 12/1992 | Kobayashi et al. | 257/724 |
| 5,291,065 | 3/1994 | Arai et al. | 257/724 |
| 5,371,405 | 12/1994 | Kagawa | 257/724 |

Primary Examiner—Sara W. Crane
Assistant Examiner—S. V. Clark
Attorney, Agent, or Firm—Mark A. Navarre

[57] ABSTRACT

A readily manufacturable low inductance linear semiconductor switching module having coplanar contacts. Also disclosed is a pretestable terminal subassembly for such a module, and a method of making such a terminal subassembly. The module can contain high power, high frequency semiconductor switching devices, operating at high power but low inductance. The module incorporates compositional, geometrical and electrical symmetry in a linear configuration. The terminal subassembly is readily fabricated and assembled into the module. In addition, it permits use of short internal leads that are readily connected to the terminal subassembly.

18 Claims, 9 Drawing Sheets

COPLANAR LINEAR DUAL SWITCH MODULE

RELATED PATENT APPLICATIONS

This patent application is related to the following patent applications, all of which are assigned to the assignee of this patent application and incorporated herein by reference:

U.S. patent application Ser. No. 08/117,924, filed Sep. 7, 1993, and entitled "High Power Semiconductor Switch Module";

U.S. patent application Ser. No. 08/116,793, filed Sep. 7, 1993, and entitled "Coaxial Switch Module";

U.S. Pat. No. 5,444,295, issued Aug. 22, 1995, and entitled "Linear Dual Switch Module";

U.S. patent application Ser. No. 08/208,244, filed Mar. 9, 1994, and entitled "Substrate Subassembly and Method of Making Transistor Switch Module";

U.S. patent application Ser. No. 08/233,572, filed Apr. 26, 1994, and entitled "Electron and Laser Beam Welding Method and Apparatus";

U.S. patent application Ser. No. 08/278,199, filed Jul. 21, 1994, and entitled "Triaxial Double Switch Module".

FIELD OF THE INVENTION

This invention relates to packaging of a high voltage/high current/high frequency semiconductor switching device. In a preferred embodiment, this invention relates to a linear type power module having an integrated terminal subassembly with coplanar internal terminal connection areas, which areas connect with a plurality of electrically paralleled high voltage and high current semiconductor switching devices that are operated at high frequency.

BACKGROUND OF THE INVENTION

The above-mentioned related patent documents U.S. Ser. No. 08/117,924 (5922-00009; H-172185), U.S. Ser. No. 08/116,793 (5922-00010; H-172190), U.S. Pat. No. 5,444,295 and U.S. Ser. No. 08/208,244, disclose a substrate subassembly that includes a metallized thin rectangular ceramic substrate having two semiconductor chips thereon and an integral thin metal connector tab extending from one of the metallized surfaces. In a preferred embodiment, one surface of a second ceramic wafer is bonded to the metallized wafer surface that has the tab. The opposite surface of the second wafer is metallized, and also has a tab extending therefrom. More specifically, the wafers are of beryllium oxide and the metallizations are copper foil sheets bonded to the wafer surface. The tabs are integral extensions of the copper foil sheets beyond the wafer edge.

The bonded copper foil sheets become copper foil layers in a composite substrate. The copper foil layers are bonded to the opposed major surfaces of the beryllium oxide wafers by direct copper bonding. Direct copper bonding is a known technique by which copper oxide is used to bond copper metal to a ceramic.

The semiconductor chips are bonded to one of the copper foil layers, preferably by soldering, to form a resultant substrate subassembly. As indicated above, the copper foil layer to which the chips are soldered, has an integral tab portion that overhangs the beryllium oxide wafer edge. The tab projects out from the beryllium oxide wafer a short distance, but a distance long enough to permit easy attachment to a cooperating terminal member for the region of each chip contacting the copper foil layer. The tab, thus, provides an integral connector portion between that copper foil and the terminal member. In the preferred five layer substrate subassembly, upper surface portions of the chips are "wire bonded" to the top copper foil layer. The tab on the top copper foil layer connects to a second terminal member, to provide low resistance communication between the second terminal member and the upper surfaces of the chips.

The substrate subassembly, as well as its manufacture and function, is the subject matter of United States patent application Ser. No. 08/208,244. Use of substrate subassemblies in modules is described and claimed in U.S. patent application Ser. No. 08/117,924 (5922-00009; H-172185). A coaxial single switch module having such substrates is the subject matter of U.S. patent application Ser. No. 08/116,793 (5922-00010; H-172190). A linear dual switch module having such substrates is the subject matter of U.S. Pat. No. 5,444,295. A special electron beam or laser beam welding technique, for bonding the copper foil tabs (of the substrate subassembly) to a terminal member, is the subject matter of U.S. patent application Ser. No. 08/233,572. The subject patent application is an improvement on U.S. Pat. No. 5,444,295.

Before discussing this application's improvements over U.S. Pat. No. 5,444,295, the latter application shall be reviewed. U.S. Pat. No. 5,444,295 focuses its description on packaging insulated gate bipolar transistors (IGBTs). IGBTs are extremely attractive semiconductor devices for power applications. An IGBT is more attractive than a power-type insulated gate field effect transistor (IGFET), which is popularly referred to as a MOSFET. An IGBT can handle both high voltages and high currents with small die size and with relatively low "on" resistance. In addition, an IGBT can be switched rapidly, making IGBTs potentially useful as switches in a three phase inverter for a high power alternating current motor application.

On the other hand, the high current density capability and low "on" resistance of the IGBT also present new challenges. The possibility of device failure is aggravated when the IGBT is handling high power. By high power, we mean current densities above about 135 amps per square centimeter of active chip area, at hundreds of volts. By high frequency switching we mean on/off frequencies above about 18 kilohertz, as for example 30 kilohertz. As might be expected, significant impedance, material and mechanical problems are encountered in handling such power at high frequencies and low resistances. This is especially true for a high power/high frequency module, in which several such IGBTs are electrically paralleled. Heretofore, the foregoing problems have been so difficult that not many high power/high frequency IGBT modules have been commercially manufactured. Those that were made thus far, have been made in relatively low volume, where each module could be individually specially crafted.

The prior U.S. Pat. No. 5,444,295 describes a high frequency/high power linear-type module that is capable of being manufactured on a commercial production basis. By commercial production basis, we mean production volumes such as used in the automotive industry. The high power/ high switching frequency IGBT modules have high efficiency and high durability, but are still economically manufacturable in automotive-type high volumes.

The prior U.S. Pat. No. 5,444,295 suggests integrating module terminal members into a premolded member and that coplanar contacts would be desirable. The subject patent application takes that suggestion further, and implements it into a specifically unique, and unsuggested, premolded unitary terminal member subassembly. In addition, the unique terminal subassembly has coplanar terminal contact areas for all substrate subassemblies in the module. Still further, the premolded terminal subassembly is pretestable, and easily assembled into the module. This increases speed and simplicity of assembly. It also allows an increase in both production speed and yield. Also, our unique premolded terminal subassembly is designed to allow module pretesting at full operating power before the final packaging steps are completed. This latter pretesting allows the discarding or repair of substandard modules at a readily fixable stage and before more value is added. Discarding or repair of a partially completed module, of course, help reduce manufacturing costs.

Further, with coplanar terminal contact areas and substrate subassembly coplanar tab ends for all switches in the module, all terminal connections for the substrate subassembly can be made in a single welding operation. This allows the electron and laser beam welding concepts of the above-mentioned U.S. patent application Ser. No. 08/233,572 to be more fully utilized. This additional utilization, provides a still further manufacturing advantage. Accordingly, our improved linear dual module and method is quite applicable to high volume and demanding applications, as for example automotive electric vehicle inverter commercial production applications.

OBJECTS AND SUMMARY OF THE INVENTION

A principal object of this invention is to provide a more-manufacturable linear multiple switch module for handling high power electrical currents at high frequencies.

Another object of this invention is to provide an improved method of manufacturing a high frequency and high current semiconductor device module.

These and other objects of the invention are achieved in a module having a plurality of groups of switching devices that have a high degree of compositional, geometrical, and electrical symmetry. Electrical leads in the module are short and planar, with input and output leads not only parallel and closely spaced but extensively overlapped, to reduce parasitic impedance effects.

In a dual switch, two groups of IGBT substrate subassemblies are symmetrically mounted in two spaced and parallel rows on a module baseplate. The substrate subassemblies are of the five layer type, and thus have two terminal tabs each. The sides of the substrate subassemblies having the tabs, face the other row. However, the rows are spaced apart sufficiently (when substrate subassembly tabs are bent upwardly) to accommodate the premolded terminal subassembly of this invention.

The premolded terminal subassembly of this invention comprises three highly contoured metal frame members. Two of the frame members each have one row of spaced fingers along one edge. These two members are mirror images of one another. This permits them to be very closely and cooperatively disposed, analogous to nesting together. They are closely spaced in a common plane, with their respective fingers oppositely disposed, effective to form two spaced but parallel rows of coplanar finger tips. The third frame member has two rows of opposed fingers, which are along two opposed parallel edges. The third frame member is aligned with the first two frame members, in parallel plane close to but spaced from the first one. This spacing interdigitates the fingers of the third frame member with the two spaced rows of fingers on the first two members. The latter fingers are contoured, effective to have portions in the plane of the fingers on the third frame member. The result is to provide tips on those fingers that are coplanar and aligned with tips of fingers on the third member.

Interior portions of the third frame member extensively overlap interior portions of the first two frame members. In addition, each frame member has an upstanding terminal lug, for attachment to appropriate buss members.

The thus-aligned and spaced frame members are partially embedded in a molded plastic body, to form a unitary assembly. The finger tips are left exposed, to form two spaced parallel rows of contact areas, for connection to the two spaced parallel rows of contact tabs on the previously mounted substrate subassemblies. The premolded terminal subassembly is placed between the two rows of substrate subassemblies, the tabs thereof bent over their respective terminal subassembly contact areas, and bonded in place, preferably by welding.

A housing can be disposed around the bonded assembly, and ancillary electrical connections made in the module before final test and final seal of the housing. In our preferred arrangement, the ancillary electrical connections are also made in the same plane as the terminal subassembly connections.

BRIEF DESCRIPTION OF THE DRAWING

FIG. 9 shows a plan top view (with cover removed) of a linear type dual switch module having two spaced rows of substrate subassemblies, and the premolded terminal substrate subassembly of FIG. 8 in between.

FIG. 12 shows a perspective view of the module of FIGS. 6–11 after completion and with its cover on.

DESCRIPTION OF THE PREFERRED EMBODIMENTS

Overview Description

Figure 1:
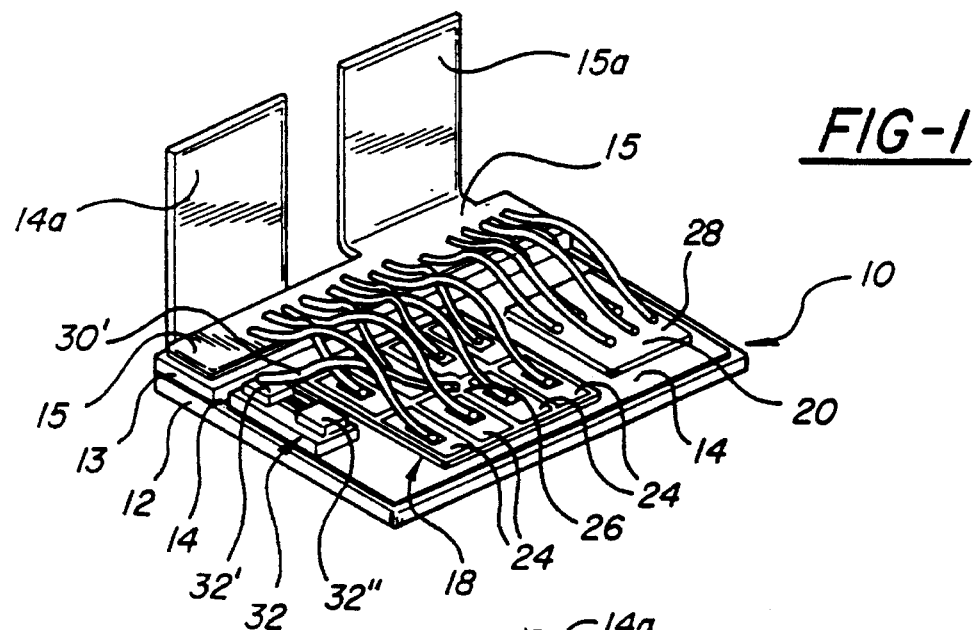
FIG. 1 shows a perspective view of a five layered switching transistor substrate subassembly used in a module of this invention.

This invention improves manufacturability and cost of the inverter module described in the related prior U.S. Pat. No. 5,444,295, while preserving its important chemical, mechanical and electrical considerations. Those aspects must be combined in a very special way to obtain a high power/high frequency switch of low inductance. This special interdependency is not believed to be readily apparent, or understood, merely from a simple description of the switch assembly. This interdependency shall be repeated herein as background for a description of the improvements this invention presents. The function and interdependency of switch parts shall be described as well.

As indicated above, the semiconductor module involved here is designed to handle high power electrical currents at high frequencies. The module has one or more active semiconductor switching devices and exhibits a high degree of compositional, geometrical, and electrical symmetry. In addition, electrical leads between any power switching device in the module, and input or output terminals for the module, are preferably kept extremely short. This helps reduce parasitic impedance effects in the module.

Input and output conductors for any given semiconductor device in the module are preferably designed to have a similar impedance. Also, if the module has multiple active semiconductor devices that are electrically in parallel, all paralleled input leads for the given switch are preferably of the same material and of the same configuration. The same is true for all paralleled output leads for that particular switch. This insures equal, i.e., uniform, impedance among all input leads and all output leads, respectively, and a similarity in impedance between input and output leads. Such uniformity and similarity in input and output leads are a part of the module compositional and geometrical symmetry contemplated in this invention.

Input and output conductors usually will each have multiple parts. For example, there may be a special external portion adapted for special connection to an external bus, an intermediate portion adapted for connection to a semiconductor switching device, and a portion that actually makes the connection. The latter part could be one or more filamentary wires or contact bumps that interconnect one or more selected regions of a semiconductor chip with the intermediate portion of a particular conductor. Hence, we construe the bonded filamentary wire or contact bump to be an inner end part of the conductor in the completed module. Compositional and geometrical symmetry is desired among all corresponding parts of all input conductors, among all corresponding parts of all output conductors, and to the extent similarity is practical, between input and output conductors.

The benefit of compositional and geometrical symmetry in input and output conductors is uniformity in current flow to and from all paralleled devices in the module. This uniformity in input/output current flow inherently comprises an initial important part of electrical symmetry contemplated in this invention.

A further extension of the foregoing geometrical symmetry provides a second part of the electrical symmetry that is important to this invention. The shape and size of the input and output conductors, at least in their intermediate portions, allows at least these portions to be disposed close to one another. The type of close disposition we have in mind is one in which the parts fit together or nest together, with a dielectric layer spacing them apart. Further, when the completed module is operated, such disposed, fitted or nested portions of the input and output conductors have an electrical current flow that is substantially parallel but opposite in direction. Outer portions can be so disposed also, as for example in concentric terminals. In concentric terminals one might say that the respective configurations are the same or similar. Others might say that they are only complementary. In any event, their configurations are such as to provide another aspect of geometrical symmetry, which can be referred to as close parallel proximity. The linear dual switch shown in the drawing is not readily amenable to concentric terminals. However, if such terminals were readily manufacturable for a linear design module, they would probably be helpful in reducing parasitic impedance.

Such extensions of geometric symmetry provide a second aspect of electrical symmetry as well. When the input and output conductor portions are placed in close parallel proximity, current flow in those portions is parallel but opposite in direction. The close proximity of the opposed current flows, allows the inductance of one current flow to at least partially negate, and even substantially cancel, inductance of the other current flow. Substantial reductions in inductance have been achieved using this effect. This inductance cancellation provides a second important part of electrical symmetry contemplated by this invention.

It is recognized that providing substantial close parallel proximity in input and output connections to a given semiconductor chip is difficult. This is because at least one of the connections to the chip will probably be a multiplicity of filamentary wires, each of which forms an arch between its ends. However, in a five layer substrate subassembly, the "wire bond" connections can be very short, as seen in FIG. 1 hereof. The "wire bond" connections only extend between the chip upper surface and the top copper foil layer of the substrate subassembly. In the five layer substrate 10, the top copper layer 15 has an over hanging tab 15a, analogous to tab 14a of the middle copper layer, to facilitate testing and connection to an input terminal member.

In a subassembly made with the five layer substrate 10, a significant portion of the interior input and output connections are parallel and in close proximity. Hence, inductance cancellation is improved. For lowest parasitic impedance, it would seem that one should make the input and output connections to the chip parallel in at least one plane. The tabs of the five layer substrate subassembly can be parallel in more than one plane. More, will be hereinafter said about the five layer substrate subassembly 10. In any event, the portions of the chip-to-conductor connections that cannot be made completely parallel should be made as short as is practical. This would favor use of contact bumps for the chip-to-conductor connection if a practical way of using them in such an assembly can be found. It also favors orienting "wire bond" chip-to-substrate interconnects parallel to the output current flow in our five layer substrate subassembly 10'. However, complete data confirming the importance of this orientation has not yet been analyzed.

Reference is now made to a third important aspect of electrical symmetry that must be observed in a module of our invention. It involves device matching. All of the transistors and diodes used in the module will have been tested and sorted. Only matched transistors and diodes are used in the module. In addition, only matched transistor/diode pairs on the substrate subassemblies are used. By this we mean that after the transistors are paired with a diode and mounted on a substrate subassembly, such as substrate subassembly 10 in FIG. 1, they are tested again. The substrates having similar operating characteristics are put in the same module. One particular operating characteristic that may be most important is the maximum current level of the transistor as mounted on the middle copper foil layer of the substrate subassembly. Thus, the individual transistors/diode pairs that are electrically connected in parallel in the module, should have similar individual operating characteristics. Moreover, the closer one wishes to operate all of such paralleled devices at their maximum power ratings, the closer they should be matched in their maximum current level rating.

Matching operating characteristics is important. If the impedance of one device is significantly less than that of other paralleled devices, that one device tends to "hog" more and more current, until device failure. Such action can occur very rapidly.

Analogously, if the transistors are not matched in their maximum current level ratings, one transistor at a lesser rating can require that all the other transistors be operated at less than their maximum current rating. Otherwise, the device having the least resistance can undesirably "hog" current.

There is a supplemental facet to the third aspect of electrical symmetry. The supplemental facet is that the matched devices should have matched cooling. Matched cooling is important because a semiconductor device generates heat during operation. If the heat is not removed, the device will increase in temperature. If it increases in temperature, its operating impedance is reduced. This effect in turn generates still more heat, which can cause an avalanche effect to catastrophic device failure. By matched cooling, we mean that chip operating temperatures remain matched, i.e., substantially equal, during even extended operation at maximum rated power. Hopefully, they even remain constant in temperature. Matched cooling can be achieved by equal cooling of the device chips. It can also be achieved by cooling each chip at a different rate, but at a rate which considerably greater than the rate at which heat is generated by the chip, and which maintains the chip below a predetermined operating temperature. Matched cooling might be obtainable by symmetrically disposing the device chips on a substrate, and cooling the entire substrate uniformly, or at least in the substrate portion where the chips are disposed. Alternatively, one might chose to selectively, but uniformly, cool each substrate area where a chip is disposed. These same concepts are applicable to the cooling of substrate subassemblies mounted on a module baseplate.

A fourth aspect of electrical symmetry is used in this invention as well. The fourth aspect of electrical symmetry resides in providing a predetermined, usually matched, control signal to each of the paralleled semiconductor devices in the module. To achieve this goal in an insulated gate controlled semiconductor switching device, the gate control circuitry should provide an identical control voltage to each device. We recognize this is possible to do by design. However, for commercial manufacturing convenience, we prefer to include at least one selectable, and preferably trimmable, resistance in the gate circuit. In our preferred embodiments, we like to include a separate trimmable resistance in the gate circuitry for each paralleled device in the module. Each trimmable gate resistance can be trimmed after the gate circuit is assembled. In such instance the gate circuit can be made with considerably greater performance tolerance, and at lesser cost. The selectable, or trimmable, gate resistance is selected, or trimmed, to provide equal voltage and/or current to each paralleled semiconductor device in the module. Such balance, or matching, of gate control signal is still another factor needed to preserve electrical symmetry in device operation. One may even want to include such a selectable or trimmable resistance in a package or module containing a single device, to tailor the output of such a package or module to be like that of another package or module.

The semiconductor switching devices contemplated for the high frequency modules of this invention are preferable and most importantly insulated gate bipolar transistors (IGBTs). IGBTs are capable of significantly higher current densities and switching speeds than insulated gate field effect transistors (IGFETs), which are popularly also referred to as MOSFETs. IGBTs have been the devices of first choice for high power applications. However, they have previously not been used extensively, especially for large volume applications, because of difficulties in suitably packaging them. One considerably difficult packaging problem was high package inductance. This invention solves that problem, and others as well. For example, this invention makes it easier to use multiple IGBTs paralleled in a module as one switch. Hence, especially high current modules can be more readily commercially produced using this invention. A principle application of this invention is for switch modules to be used in an three phase inverter for an electric automobile.

On the other hand, MOSFET, or IGFET, modules can benefit from this invention too. Nonetheless, for simplicity, the following discussion will focus on IGBT modules, because they can benefit the most from this invention.

Figure 2:
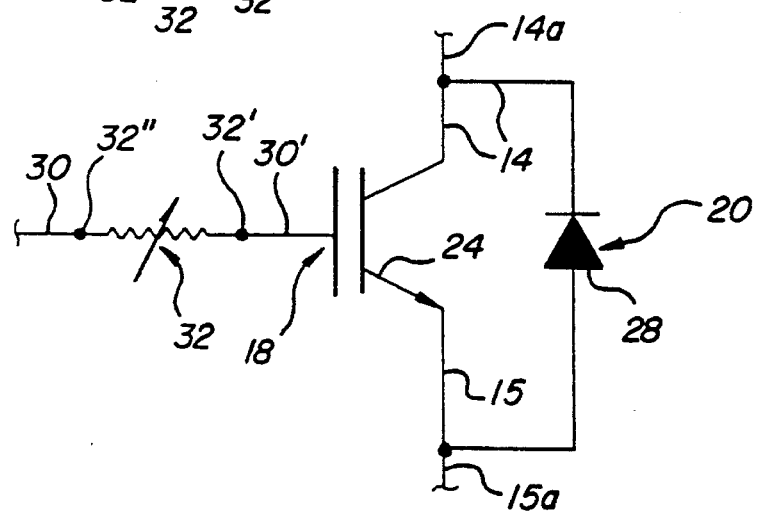
FIG. 2 shows an electrical schematic of the switching transistor substrate subassembly shown in FIG. 1.
Figure 3:
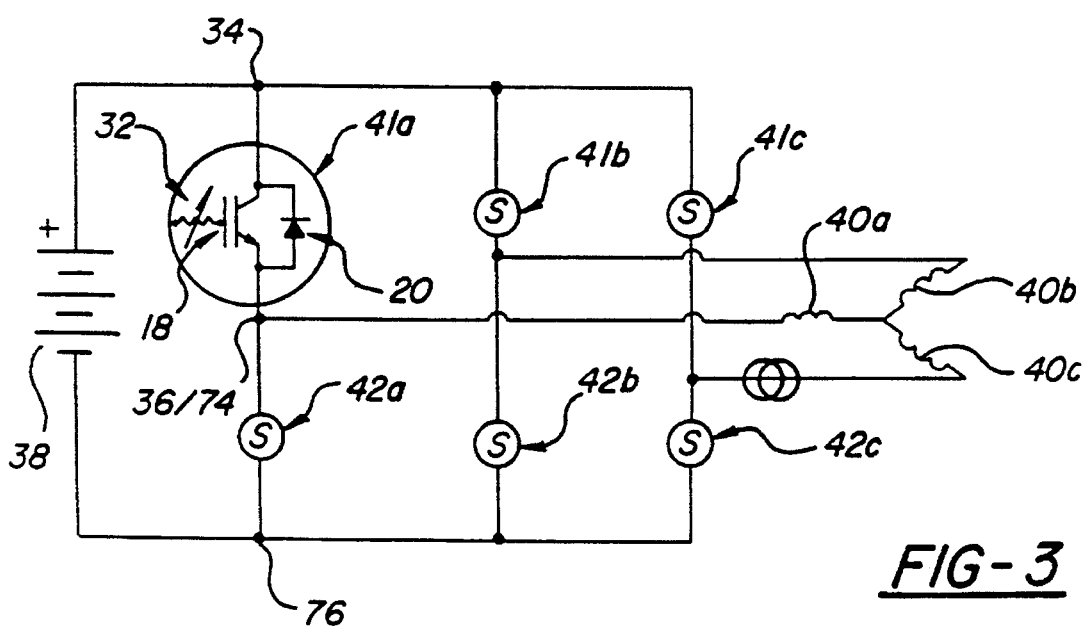
FIG. 3 shows an electrical schematic of a three phase DC to AC inverter which uses six switching transistor substrate subassemblies such as shown in FIG. 2, or three of the dual switch modules illustrated in FIGS. 4–12.

Paralleled switching transistor chips can form single or multiple switches. A single switch is schematically shown in FIGS. 2 and 3. A double, or dual, switch is conceptionally schematically shown in FIG. 4 and actually schematically shown in FIG. 5. The high side/low side dual switch is actually shown in linear form in FIGS. 6 through 12. However, this invention is even more beneficial to multiple switch modules.

Detailed Description

Reference is now specifically made to FIG. 1. FIG. 1 shows a substrate subassembly 10 that comprises a 21 millimeters by 14.5 millimeters beryllium oxide plate or wafer 12 of about 1 millimeter in thickness. Beryllium oxide is a particularly effective dielectric material for use in this application. It has a high thermal transfer coefficient but has a thermal expansion coefficient similar to that of silicon. Aluminum oxide and aluminum nitride also generally match silicon in thermal expansion characteristics. However, beryllium oxide has a thermal transfer coefficient considerably higher. In such instance, wafer 12 can be made correspondingly thicker, which, in turn, reduces parasitic capacitance between the upper surface and lower surfaces of wafer 12 which are metallized, as hereinafter described. We also hereinafter describe the metallized wafer as soldered to the surface of an electrically conductive bottom plate, or baseplate, of a housing. Regardless of the size of the housing, or the number of switching transistors disposed in the housing, wafer 12 is only big enough to support one switching transistor and necessary associated circuitry, such as for thermal tracking or other symmetry purposes. This reduces the area of the metallized surfaces, and further reduces parasitic capacitance.

Wafer 12 is metallized as follows. Upper copper foil plate 14 and a lower copper foil plate 16 are disposed on opposite faces of wafer 12. Copper foil plates 14 and 16 are each about 20 millimeters by 13.5 millimeters and are about 0.25 millimeter thick. They are secured to the opposite major surfaces of beryllium oxide wafer 12 by any acceptable technique, as for example, direct copper bonding. Direct copper bonding is a known and accepted practice in which copper oxide is used to bond a copper sheet to a ceramic substrate. Upper copper plate 14 has an integral generally rectangular extension 14a that is about 6–9 millimeters wide and about 13.3 millimeters long. Accordingly it overhangs wafer 12 about 12.8 millimeters. The exposed portions of the middle copper foil layer 14, excluding tab 14a, has a 6.35–10.2 micron silver coating thereon to enhance solderability.

The five layer substrate subassembly 10 of FIG. 1 also includes a second beryllium oxide wafer 13 bonded to middle copper foil layer 14, and a top copper foil layer 15 bonded to the second beryllium wafer 13. The hereinbeforementioned U.S. patent application Ser. No. 08/208,244 teaches that layer 13 can assume many configurations. It can be a full wafer with apertures in it that expose copper foil layer 14. The semiconductor chips are soldered to copper foil layer 14 within the apertures. The latter patent application also discloses that upper dielectric layer 13 need only be a bar of dielectric, as shown in FIG. 1 hereof.

It is convenient and preferred at this time to make the upper dielectric layer 13 of a ceramic, most preferably of a beryllium oxide bar about one millimeter thick. Its length is about 21 millimeters and its width is about 3–6 millimeters. Accordingly its length is about the same as the lower wafer 12. Its width is wide enough to allow "wire bonds" to be conveniently made to it. However, its width is small enough to expose a sufficient surface area of middle copper foil layer, on which to mount a switching IGBT chip 18, an SFD chip 20, a resistor chip 32, and possibly a Kelvin contact plate (not shown), if needed. Resistor chip 32 can be a preselected resistance or a trimmable resistance, as is desired. For an IGBT power transistor having a die size of about 9.8 millimeters×9.8 millimeters, a trimmable resistor having a nominal printed resistance of about 4 ohms (trimmable to about 7.5 ohms) can be used. More will be hereinafter said about these last mentioned items.

The top copper foil layer 15 is about 0.25 millimeter thick and is contoured to match the contours of the second or top dielectric layer 13. Hence, its length is about 20 millimeters and its width is about 3–5 millimeters. More specifically, it is about 1 millimeter less in width than the width of top dielectric layer 13. However, top copper foil layer 15 also includes a tab portion 15a that overhangs top dielectric layer 13, analogous to the overhang of tab 14a. Except for being offset from tab 14a and being slightly shorter than tab 14a, tab 15a is quite similar. Accordingly, its width is about 6–9 millimeters and its length is about 13.3 millimeters, which gives it an overhang of about 12.8 millimeters. The overhangs can vary, depending on the location and relative level of the lateral terminal contact surfaces to which these tabs are to be connected. In our invention, we provide a line of lateral contact surfaces. Thus we prefer that the lengths of tabs 14a and 15a be such that they overlap onto this line a generally similar amount for similar and concurrent bonding. Such a length might actually make them of unequal lengths when bent upwardly as shown in FIG. 1. It should be mentioned that direct copper bonding is also preferably used to bond top dielectric layer 13 to the upper surface of middle copper foil layer 14 and to the lower surface of top copper foil layer 15. The result is a composite substrate of very distinctive properties.

A beryllium oxide wafer of 1 millimeter thickness is preferred for dielectric bar 13. However, dielectric bar 13 need not necessarily be of this thickness, and it may not necessarily be of beryllium oxide. In fact, it may not even necessarily have to be a discrete wafer, as will hereinafter be explained. It is preferred that substrate subassembly 10 have a thermal coefficient of expansion approaching that of silicon. That is why beryllium oxide is used for wafer 12. If the ceramic layer 13 is to be other than of beryllium oxide, we would prefer that the alternative ceramic material would have a thermal coefficient of expansion similar to that of beryllium oxide, i.e., similar to silicon. One such alternative material is aluminum oxide. Since this layer may not have as active a role in thermal transfer as lower ceramic layer 12, aluminum oxide might turn out to be quite satisfactory for layer 13. Other materials might work as well, depending on the application. Ceramic may not even have to be used, especially if the alternative material had a compatible coefficient of expansion with silicon. If not, we prefer that the alternative material be thin enough not to adversely affect the preferred coefficient of expansion of the resultant composite.

On the other hand, one also has to be concerned that the dielectric layer 13 be thick enough not to be detrimentally affected by "wire bonding". As mentioned, switching transistor chip 18 is mounted on middle copper foil layer 14. Surface regions of switching transistor chip 18 are shown to be electrically connected with top copper foil layer 15 by "wire bonding". In such instance, the ends of filamentary wires are going to be attached to the copper foil layer 15 over ceramic layer 13 by techniques that subject these layers to localized high pressures. Ceramic layer 13 can be a coating or a wafer. However, the coating or wafer has to be strong enough to withstand such bonding techniques. If dielectric layer 130 is a coating or wafer that is too thin, the "wire bonding" techniques can possibly fracture it, and cause an immediate, or subsequent, electrical short between copper foil layers 14 and 15.

On the other hand, chip 18 might be connected to the top copper foil layer 15 by techniques that do not subject dielectric layer to such high localized pressures. For example switching transistor chip 18 could be pre-bonded to inner ends of a convergent finger connector pattern, such as in tape automated bonding. The outer ends of the convergent fingers could be attached to top copper foil layer 15 by a lower pressure bonding technique, such as soldering or lower pressure thermocompression tape bonding. In such instance, it is conceivable that upper dielectric layer 13 could be formed of other materials, in other thicknesses, and by other techniques. In such instance, upper copper foil layer could be bonded to dielectric layer 13 by other techniques. It such further instance, upper copper layer 15 might integrate the convergent finger lead pattern. In any event, these alternative examples are given to illustrate that deviations might be possible from the preferred embodiments described herein, without departing from the spirit of the invention in our five layer substrate subassembly 10.

For completeness, it is mentioned that the surface of IGBT switching transistor 18 is divided into a multiplicity of aluminum electrode or contact areas, i.e., "wire bond" areas, to reduce emitter series resistance. In this example, there are eight such areas. They surround a smaller rectangular aluminum alloy gate electrode or contact area 26. The back side of the chip 18 forms a collector region for the IGBT switching transistor 18, which region is in low resistance electrical communication with copper plate 14, as by soldering or the like. The larger rectangular regions 24 on the upper surface of chip 18 form generally uniformly spaced emitter contacts on the IGBT surface. As indicated above, emitter contacts 24 surround the central gate electrode contact region 26. A single filamentary wire is adequate for gate lead contact because the gate lead does not carry significant current.

The emitter region of the diode chip 20 is its entire upper surface, which is metallized to have an electrode thereon 28 of aluminum alloy suitable for wire bonding. The lower surface of diode chip 20 is soldered to the upper surface of copper plate 14. Accordingly, the cathode of chip 20 and the collector of the switching transistor 18 are electrically paralleled.

Referring back to the preselected or trimmable resistance chip 32, it could be disposed on the top copper foil layer 15. It is preferably on middle copper foil layer 14 to make its "wire bond" surfaces closer to the level of the surface of copper foil layer 15. Still further, one may choose not to include resistance chip 32 at all in the substrate subassembly 10. It could be disposed on the module baseplate, as shown in the module of the previously mentioned U.S. Pat. No. 5,444,295. However, in most instances we believe it would be preferable to include the resistance element 32 in the substrate subassembly, so that it could be "wire bonded" to the central contact 26 on chip 18 while other "wire bonds" to chip 18 are being made. For example, as is apparent from examination of FIG. 1, it may be desirable to bond wires to only some of the emitter regions 24 of IBGT chip 18. Then, a wire is bonded between resistor chip 32 and the central contact 26 of IGBT chip 18. After that, the rest of the filamentary wires are bonded to emitter regions 24 of IGBT chip 18. Central contact 26 of IGBT chip 18 is the gate contact for this chip. It may not be necessary to trim the resistor of resistor chip 32 to any particular value before testing substrate subassembly 10 before mount on a module baseplate. One may choose to reserve this trim until after final assembly. In such pre-testing, the end of the resistor on chip 32, to which the aforementioned "wire bond" is made, would be probed to supply operating gate voltage to gate contact 26 on transistor chip 18. If preselected well, no trim made be needed of resistance 32 at all, even after final assembly.

The end of tab 14a is at a lower level on substrate subassembly 10 than that of tab 15a, whereby they might conveniently contact terminal elements at different levels. However, as previously indicated, the ends of tabs 14a and 15a could be made to be coplanar if the terminals they were to contact were coplanar. In either event, one can respectively clamp the separate input and output test terminals to the ends of tabs 14a and 15a to conveniently test the substrate subassembly 10 at full power (if it is properly cooled).

If not yet mounted on the module baseplate, the substrate subassembly would have to be clamped to a cooling substrate for significant power testing. After such testing, of course, the substrate and subassemblies can be sorted and grouped. Such testing and sorting is obviously more precise if the substrate subassembly can be tested at full power. The manner in which the substrates subassembly 10 is tested is not important to this invention.

It should be mentioned that it is preferred to also use a soft, fast silicon semiconductor diode (SFD) 20 on substrate 10 to support the IGBT chip 18. SFD chip 20 is not considered to be an insulated gate device, or a high powered semiconductor switching transistor. The SFD function is known and is described in connection with FIG. 2 of this patent application.

FIG. 2 shows an electrical schematic of the substrate subassembly 10 illustrated in FIG. 1. The SFD chip 20 forms a blocking diode across the emitter collector terminals of the switching transistor. It is used to protect the switching transistor 18 by shunting current from temporarily reversed voltages that may occur in the system in which this switch is used. The transistor chip 18 and diode chip 20 are preferably made of substantially similar semiconductor material, and by substantially similar processes so that they can have substantially similar performance characteristics, including change in initial characteristics with change in temperature. Still further, each shunting diode, or SFD, 20 is disposed in close thermal proximity to its switching transistor 18 so that the pair would experience a similar temperature environment. This aids in providing more consistency in operation of the resulting electrical switch that they comprise.

Figure 4:
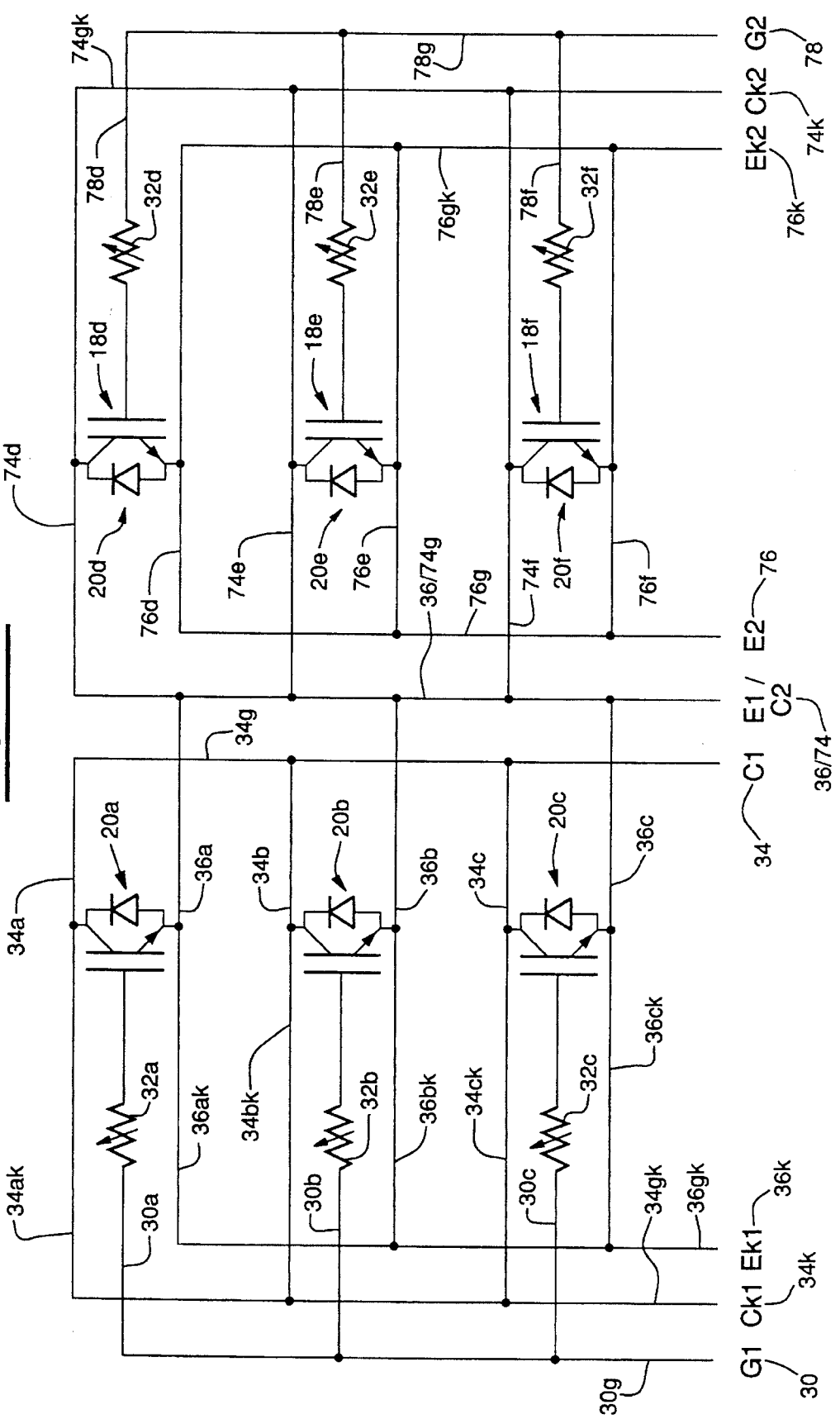
FIG. 4 shows a conceptual electrical schematic of a dual switch module containing two groups of mutually electrically paralleled substrate subassemblies of the type shown in FIGS. 1 and 2.
Figure 5:
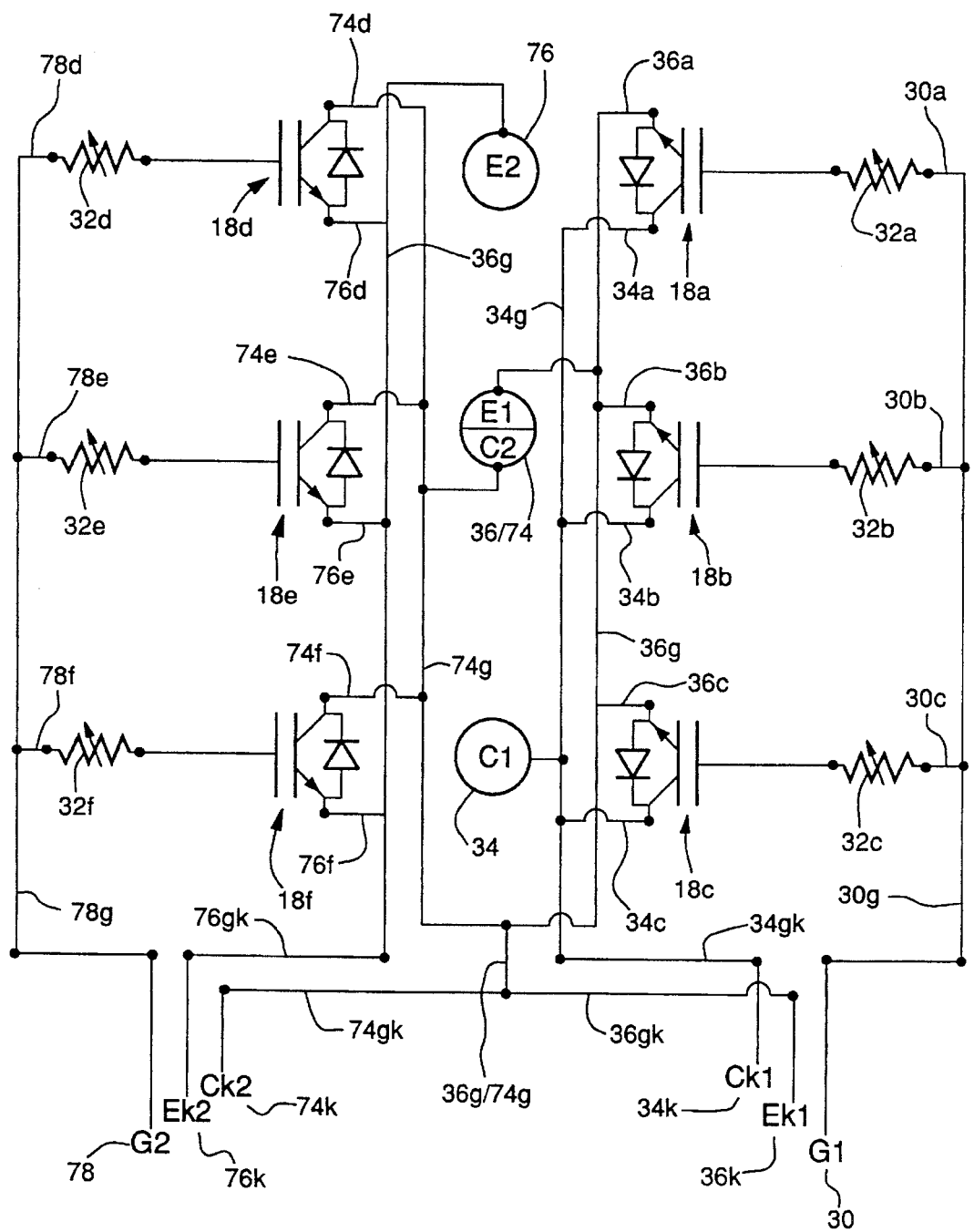
FIG. 5 shows the electrical schematic of FIG. 12, as it is actually embodied in FIGS. 6–12.

FIG. 3 shows an electrical schematic of a three-phase inverter circuit that converts direct current (DC) from a battery 38 to alternating current (AC) for use by a alternating current motor 40. As it can be seen, each of the three motor windings 40a, 40b and 40c is connected between a pair of switching transistors, or a pair of two groups of electrically paralleled switching transistors. The transistor, or group of such transistors, forming a single switch on the high side is separately indicated by each of reference numerals 41a, 41b, or 41c. The transistor, or group of such transistors, forming a single switch on the low side is separately indicated by each of reference numerals 42a, 42b, or 42c. Each such switch 41a, 41b, 41c, 42a, 42b, or 42c can be the substrate subassembly of FIG. 2. Alternatively, each such switch can be either one of the two IGBT(SFD) groups 18a–18c or 18d–18f of FIGS. 4–5. For clarity of illustration only one transistor/diode pair and its associated terminal resistance is shown in FIG. 3 in the enlarged area. In FIGS. 4 and 5, the IGBT(SFD) group 18a–18c is intended to represent switch 41a and the IGBT(SFD) group 18d–18f is intended to represent switch 42a. However, this also would correspond to the switch pairs 41b/42b or 41c/42c. The module of this invention described herein contains such a pair of switches. For this reason the module described herein is referred to as a double or dual switch.

As indicated above, when IGBTs are used for such switches, they cannot be satisfactorily used by just turning them on and off once for each cycle they are to cover. These devises turn "on" hard, which produces a square wave, not a sine wave. To get appropriately configured sine wave output, IGBTs are turned "on" and "off" very rapidly, many times during each sine wave cycle, using increasing and then decreasing gate voltage and pulse width modulation. Turn on/turn off frequencies of 20,000–30,000 Hz are not unusual for automotive traction motor applications. As previously indicated, the parasitic capacitance associated with such rapid switching is so significant that it has heretofore prevented high power IGBTs from being extensively used. Modules incorporating IGBTs to be used at high power have to have a critical balance, as hereinbefore described. This invention provides such balance in a more economical and reliable manner, which manner is suitable for high volume commercial production. The inventions disclosed herein are expected to be used by a major manufacturer to commercially make modules for an automotive electric vehicle AC traction motor application.

Others might think that the paralleled transistors in a given switch group should be mounted on a common ceramic substrate. However, if all the paralleled transistors are mounted on a common substrate, the substrate becomes unduly large in area and complexity. Masking of the substrate for selective metallization may be required. The large area tends to increase parasitic capacitance between the top metallized surface of the ceramic substrate and a conductive backplate on which it will be disposed. The large area may also preclude use of beryllium oxide, even though its higher thermal transfer rating might allow a higher current rating and/or produce a lower parasitic capacitance in the resulting module. Increased complexity, that would be inherent to the large substrate, reduces yields of the large substrate, and thereby increases its cost.

Each switching transistor is disposed on its own ceramic substrate. As indicated above, this is used to minimize total substrate area. However, this provides still another benefit. If the substrates are relatively small, substantially the entire substrate surfaces can be metallized, without appreciably increasing parasitic capacitance. This eliminates masking for metallization. Elimination of masking, further reduces cost. Yields of transistor groups will increase, because imperfect one transistor/substrate combinations or subassemblies can be discarded or easily repaired before the groups are formed. In addition, the mounting of a smaller substrate onto the housing bottom plate is easier, and more readily fixable if the initial mount is not satisfactory. Accordingly, yields can increase still further. Increased yields, of course, mean lower cost products, and indirectly superior products.

A corollary to the foregoing is that such cost reductions tend to make use of beryllium oxide even more practical for larger volume use. Hence the attendant increase in module performance becomes more practical for commercial production applications, and improved products more available to the public. More specific aspects of substrate subassembly 10, its method of formation, tabs 14a and 15a, and progressive assembly techniques involving substrate subassembly 10 are described and claimed in the related U.S. patent application Ser. No. 08/208,444.

FIG. 4 shows the electrical schematic of a double switch from a conceptual standpoint for ease of understanding. FIG. 5 functionally shows the same electrical schematic but represents the form it takes in the following FIGS. 6–12. FIGS. 4 and 5 each show two three-member groups, 18a–18c and 18d–18f, of transistor/diode pairs. For convenience, the IGBT/SFD pairs are referred to by reference numerals pertaining to the IGBTs themselves. The three IGBT/SFD pairs in each group are electrically in parallel, and form one switch. The transistors and diodes in each group were initially tested and sorted before mounting on their discrete substrates. After mounting, each transistor/diode pair was tested and sorted as a pair. Similar pairs were then matched and placed in three-member groups. Two such similar three-member groups were then placed together to comprise IGBT/SFD pairs 18a–18c and 18d–18f. Accordingly, the output characteristics of each substrate subassembly 10, i.e., mounted pair, in each group will be substantially the same, to provide the symmetry discussed above. In addition, it is highly preferred that all the transistors in both groups be the same, to extend the symmetry even further.

In FIGS. 4 and 5, each gate lead for each switching transistor 18a–18f has a pre-selected or trimmable resistance 32a–32f in series with it. In the following discussion, for simplicity, it shall only be referred to as a trimmable resistance. The trimmable resistance is also indicated by reference numerals 32a–32f in the following Figures of the drawing. Its importance will hereinafter be explained.

As mentioned, the electrical schematic in FIG. 4 conceptually shows how the three switching transistors and their associated diodes, that form each switch are electrically paralleled. As previously indicated, only switching transistors having quite similar electrical performance characteristics should be used in each group. In such instance, no one switching transistor will tend to "hog" current, and cause an avalanche failure of the transistor and then the module. Analogously, care must be taken that all the paralleled transistors are mounted the same, so that they are more likely to be at the same operating temperature.

Further, there can be differences in length, and an attendant variance in voltage drop, in the gate lead 30g to the respective switching transistors 18a–18c and 18d–18f in either or both of Groups I and II of the module. Even slight differences in such voltage drop can be avoided. The trimmable resistors 32a–32c in the gate lead of group 18a–18c protect against this difference. The trimmable resistors 32d–32f in the gate lead of group 18d–18f protect the latter group against this difference. Each of the trimmable gate lead resistors allows the gate voltage supplied to each transistor to be the same. Thus, the "on" resistance characteristics of each switching transistor in the group comprising the resulting module is more likely to be similar. This helps make actual performance of the switching transistors match even more after mount. The trimmable resistor may even be used to adjust operating level of the mounted and assembled group to the level of one switching transistor that results in a lesser performance characteristic than pretesting indicates it should exhibit. Thus, the potential for current "hogging" in the group is reduced even further. Such a resistance can even be used to match the switches paired in an inverter, i.e. switches 41a and 42a, especially if only one or two transistors are used for each switch 41a and 42a.

It can be further seen in FIGS. 4 that the normal conceptual way of presenting a circuit is to dispose the emitter lead of one device next to the collector lead of another. In FIG. 5, the schematic more actually represents the layout of our module. FIGS. 4 and 5 are included in this description for comparison with the module of U.S. Pat. No. 5,444,295 that is improved by this invention. For easy comparison, the same corresponding reference numerals are used for corresponding parts, as much as is practical. This may leave some intermediate reference numerals unused in this patent application.

As mentioned, the Group I IGBT/SFD pairs 18a, 18b and 18c, and their associated resistances 32a, 32b, and 32c, represent switch 41a of FIG. 3. The Group II IGBT/SFD pairs 18d, 18e and 18f, and their associated resistances 32d, 32e, and 32f represent switch 42a of FIG. 3. The transistors in Group I have collector leads 34a, 34b and 34c, which are connected to collector buss 34g. The Group I collector buss 34g is connected to collector terminal 34, which is labelled C1. The gate leads for each of 18a, 18b, and 18c respectively connect with trimmable resistances 32a, 32b and 32c. Trimmable resistances 18a–18c connect with gate buss 30g that, in turn, is connected to gate terminal 30. Gate terminal 30 is labelled G1. Emitter leads 36a, 36b and 36c connect with buss 36/74 that, in turn, connects with terminal 36/74. This terminal is labelled E1/C2 to connote that this terminal is the emitter terminal for the Group I pairs. It is also the collector terminal for the Group II pairs, as will later be described.

Collector Kelvin leads 34ak, 34bk and 34ck connect with collector kelvin buss 34gk. Collector Kelvin buss 34gk is connected to collector Kelvin terminal 34k, which is labelled Ck1. Analogously, emitter Kelvin leads 36ak, 36bk and 36ck connect to emitter Kelvin buss 36gk. Emitter Kelvin buss 36gk is connected to emitter Kelvin terminal 36k, which is labelled Ek1.

The Group II transistors 18d, 18e and 18f have collector leads 74d, 74e and 74f. It can been seen that the Group II collector leads 74d, 74e, and 74f are connected to the same buss 36/74g as the Group I emitter leads 36a, 36b and 36c. Accordingly, terminal 36/74 functions as an emitter terminal for the Group I transistors, and as a collector terminal for the Group II transistors. The emitter leads 76d, 76e and 76f for the Group II transistors have their own buss 76g, which is connected to the Group II emitter terminal 76. Group II emitter terminal 76 is labeled E2 in FIGS. 4 and 5.

Since it is intended that the transistors in Group I will be in the "on" condition when the transistors in Group II are in the "off" condition, and vice versa, a separate gate control electrode is needed for each group. Accordingly, the Group II transistors have their own gate terminal 78, gate buss 78g and gate leads 78d, 78e and 78f. As with Group I, each of gate leads 78d, 78e and 78f respectively have laser trimmable variable resistance 32d, 32e and 32f in series with them. They connect to Group II gate buss 78g, which connects with Group II gate terminal 7. Group II gate terminal 78 is labelled G2.

Analogously, separate Group II emitter Kelvin leads and an emitter Kelvin buss are provided that connect with the separate Group II emitter Kelvin terminal 76k. Group II emitter Kelvin terminal 76k is labelled Ek2. Also analogously, separate Group II collector Kelvin leads and buss are provided that connect with the separate Group II collector Kelvin terminal 74k. Group II collector Kelvin terminal 76k is labelled Ck2.

The Group II collector leads 74d, 74e and 74f connect to buss 74g, which connects with terminal 34/74, as indicated above. Since terminal 36/74 is an emitter terminal for Group I and a Collector terminal for Group II, it is labelled E1/C2.

Reference is specifically now made to FIG. 5, which show a schematic circuit diagram of the actual layout of the dual switch module shown in FIGS. 6–12. In an overview, the module of FIGS. 6–12 reverses placement of switch Groups I and II, from left and right to right and left. Also, within each such group, emitter and collector Kelvin contacts are reversed. In addition, multiple Kelvin connections are omitted. Further, the Kelvin connections for Group I emitter and Group II collector are shared and made very short. Further, in comparison to the prior U.S. Pat. No. 5,444,295, the terminals still have generally flat portions but they are so thick and highly contoured as to not even be readily recognizable as "plates". They have outwardly extending finger portions, and the finger tips are interdigitated and coplanar. In further comparison with the prior U.S. Pat. No. 5,444,295, the relative disposition of plate-like portions 74g and 76g are reversed in the new design. Because of the reversal in plate portions 74g and 76g, plate-like portions 36g and 74g are now coplanar, and have been integrated into a single piece. In addition, terminal lugs have been integrated with their respective terminal "plates". All of these elements are held together in mutually spaced relationship by a nonconductive plastic matrix. The result is a pretestable unitary molded terminal subassembly having coplanar terminal connection areas. An improved substrate subassembly 10 is used in our improved module. The improved substrate subassembly 10 has coplanar terminal tabs, and is described and claimed in U.S. patent application Ser. No. 08/208,244. In addition, it integrates a trimmable resistance into the substrate subassembly 10. One version of the improved substrate subassembly 10 is shown in FIG. 1 hereof. As indicated, it includes an IGBT/SFD and a selected resistance unit 32. It also has coplanar terminal tabs 14a and 15a.

Summarizing, in FIG. 5 the IGBT/SFD pairs are referred to by reference numerals 18, along with a suffix of a–f to indicate the respective pairs. The resistance units 32 for each pair have corresponding suffixes. This same reference numeral system is carried through into FIGS. 6–12. Further summarizing, Group I devices comprise switch 41a in FIG. 3. The Group II devices comprise switch 42a in FIG. 3. Also, in FIG. 5, Group I devices are on the right, not the left. The gate buss for IGBT/SFDs 18a–18c is 30. The gate buss for IGBT/SFDs 18d–18f is 78g. Emitter and collector busses for both of Groups I and II connect with central terminals C1 (reference numeral 76), E1/C2 (reference numeral 36/74), and C2 (reference numeral 34).

As further seen in FIG. 5, our new module has separate emitter Kelvin, collector Kelvin, and gate terminals for each of Groups I and II. This is similar to the prior U.S. Pat. No. 5,444,295. However, in our new module the emitter and collector busses (i.e., plates) are relatively thick. In this new module, only one connection between each of the Kelvin terminals and the thick terminal plates is made. The interconnecting wires between the Kelvin terminals and the terminal plates are respectively designated by reference numerals 34gk, 36gk, 74gk, and 76gk. The part of the E1/C2 terminal plate that 36gk and 74gk connect to is designated by reference numeral 36g/74g. Reference is now made to FIGS. 6–12, which show the actual module illustrated schematically in FIGS. 3–4. As mentioned earlier, for comparison purposes, the reference numerals used in FIGS. 6–12 generally correspond to the reference numerals used in FIGS. 12–20 of the earlier U.S. Pat. No. 5,444,295. Also, the reference numerals of FIGS. 6–12 hereof correspond to the reference numerals used in the electrical schematics in FIGS. 4–5 hereof.

Figure 6:
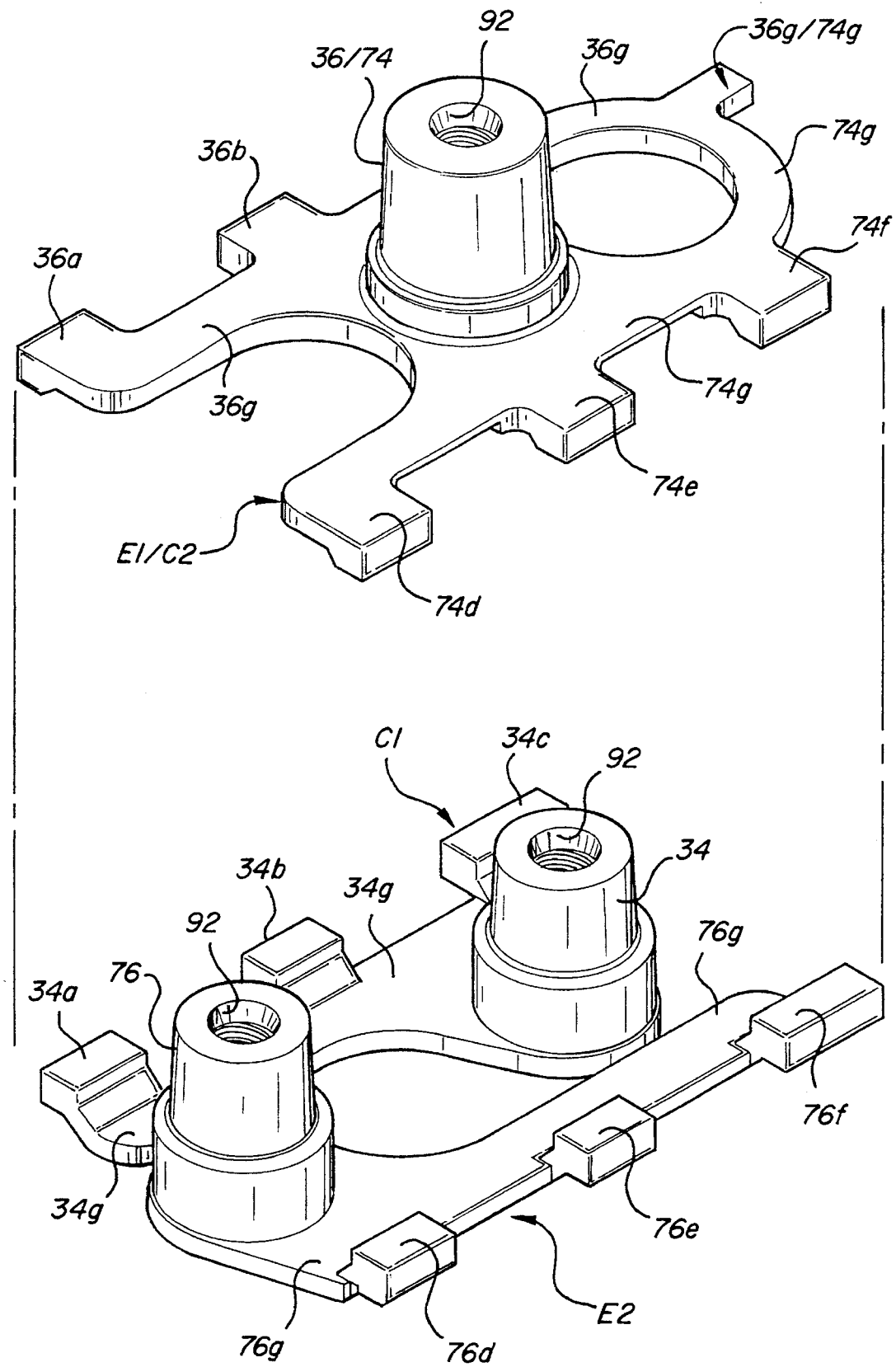
FIG. 6 shows an exploded perspective view of three terminal frame members before being molded into a composite unitary terminal subassembly.

FIG. 6 shows an exploded perspective view of three terminal frame members before the frame members are molded into a composite unitary terminal subassembly. Each frame member incudes a highly contoured plate-like portion (indicated by suffix letter "g") and an upstanding terminal lug portion. More specifically, the frame member shown in the upper part of FIG. 6 has a dual function, and is designated as E1/C2. It serves as the Group I emitter terminal connection and also as the Group II collector connection. Accordingly, the left portion of its plate is designated by reference numeral 36g, while its right portion is designated by reference numeral 74g. It has an extension at its right end that is designated by reference numeral 36g/74g. It also has an integral upstanding terminal lug 34/74.

The right end of frame member E1/C2 has an aperture therein, that accommodates terminal lug 34 of one of the lower frame members. The left end of the frame member also has an aperture therein, to accommodate terminal lug 76 of the other of the lower frame members. The latter aperture is open-ended, so that it can be considered to be "U" shaped. More will be said about this later.

Each of plate portions 36g and 74g is also contoured on its outer edges, to form three fingers. While the opposed edges of the plates 36g and 74g are highly contoured, they are symmetrical. Hence, the fingers are opposed from one another. The edges are highly contoured but the finger tips on each edge form a straight line, and the lines of the opposed edges are parallel. In addition, the upper surface of the fingertips are all coplanar. In fact, in this embodiment of the invention, the entire upper surface of frame member E1/C2 is flat, except for the terminal lug 36/74. The flat upper finger tips 36a, 36b and 36c form connection areas for emitter tabs 15a of the Group I substrate subassemblies 10a, 10b and 10c, respectively. Analogously, the flat upper finger tips 74d, 74e and 74f form connection areas for collector tabs 14a of the Group II substrate subassemblies 10d, 10e and 10f, respectively.

As indicated, terminal plate portions form a unitary element that has an integral upstanding terminal lug 36/74. Terminal lug 36/74 has a threaded central bore 92 for bolting terminal lug 36/74 to an external buss (not shown). The top of bore 92 is chamfered.

Flat portions 36g and 74g of frame member E1/C2 and terminal lug 36/74 are preferably made integrally, to get greatest uniformity in electrical properties. However, it is recognized that others may prefer to make one or more of these parts separately, and then bond them together, as by soldering or welding.

The lower portion of FIG. 6 shows two more frame members C1 and E2 that are disposed side-by-side but are spaced from one another. In addition, frame members C1 and E2 are mirror images of one another. hence, they are symmetrical. In addition, they respectively have coplanar plate-like portions 34g and 76g. Plate-like portion 34g is basically flat but has a highly contoured periphery and an integral upstanding terminal lug portion 34. Frame member C1 serves as the Group I collector terminal connection. Plate-like portion 76g is also basically flat but has a highly contoured periphery and an integral upstanding terminal lug portion 76. Frame member E2 serves as the Group II emitter terminal connection.

Terminal lugs 34 and 76 each have a threaded central bore 92 for bolting an external buss (not shown) to the terminal lug. The top of bore 92 is chamfered. While these frame members and terminal lugs are also made integrally, it is recognized that others may prefer to make them separately, and then bond them together, as by soldering or welding. We believe that the unitary frame member provides more uniformity in function.

The inner periphery of frame member C1 is contoured to accommodate the portion of frame member E2 that contains terminal lug 76. The inner periphery of frame member E2 is analogously contoured. The outer periphery, or edge, of plate 34g forms fingers 34a, 43b, and 34c. The outer periphery, or edge, of plate 76g forms fingers 76d, 76e and 76f. The fingers are opposed from one another. The edges are highly contoured but the finger tips on each edge form a straight line. Further, the two lines they form are parallel. In addition, the upper surface of the fingertips 34a, 34b, 34c, 76d, 76e and 76f are all coplanar. However, as can abe seen the upper surface of finger tips 34a, 34b, 34c, 76d, 76e and 76f are only coplanar with each other. They are not coplanar with the upper surface of coplanar plates 34g and 76g. Instead fingertips 34a, 34b, 34c, 76d, 76e and 76f are bent upwards. They are bent upwards slightly more than the thickness of plate portions 36g and 74g of upper frame member E1/C2. Fingers 34a, 34b and 34c are bent upwards enough to be coplanar with the upper surfaces of fingers 36a, 36b and 36c, when the frame members are assembled together. Analogously, finger tips 76d, 76e and 76f are bent upwards enough to make their upper surfaces coplanar with the upper surfaces of finger tips 74d, 74e, and 74f, when the frame members are assembled together. The flat upper surfaces of finger tips 34a, 34b and 34c form connection areas for collector tabs 14a of the Group I substrate subassemblies 10a, 10b and 10c, respectively. Analogously, the flat upper finger tips 76d, 76e and 76f form connection areas for emitter tabs 15a of the Group II substrate subassemblies 10d, 10e and 10f, respectively.

Figure 7:
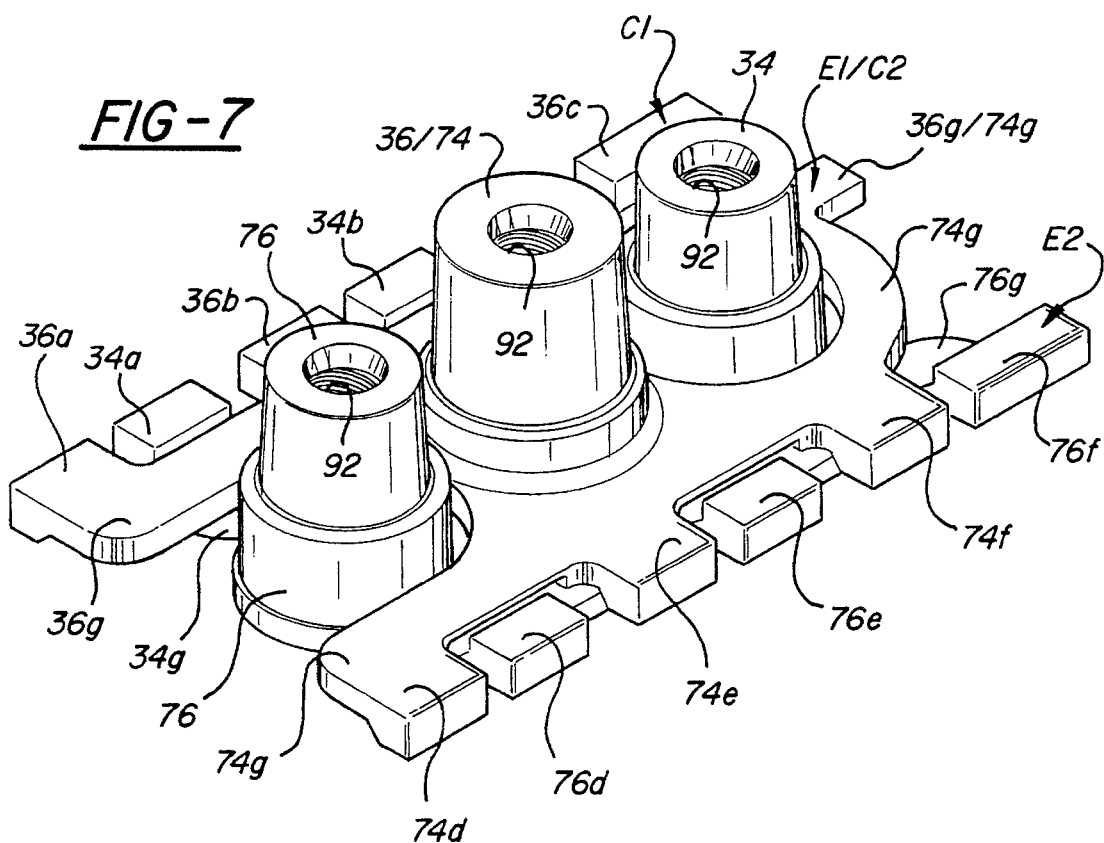
FIG. 7 shows a perspective view of the three terminal frame members shown in FIG. 6 but as assembled for molding.

As seen more clearly in FIG. 7, the fingers of the upper frame member E1/C2 are offset from the fingers of the lower frame members C1 and E2. When frame members E1/C2, C1 and E2 are assembled together, fingers of the upper and lower frame members locate between each other. We refer to this herein as interdigitation. As shown in FIG. 7, the upper and lower frame members are disposed close to one another. However, they are still spaced from one another, to maintain electrical isolation from one another. This close spacing is shown in FIG. 7, where the fingers of the lower frame members bend upwardly enough to have their upper surfaces coplanar with the upper surfaces of the finger tips on the upper frame member E1/C2. This not only provides coplanarity for terminal lead bonding; it also provides finger symmetry and closely spaced parallelism for reducing terminal lead inductance.

It is important to note that in the close spacing of the terminal frame members, plate portion 36g significantly overlaps plate portion 34g, in closely spaced and substantially parallel disposition. Analogously, plate portion 74g significantly overlaps plate portion 76g, in closely spaced and substantially parallel disposition. Counter flow of current in these closely spaced and parallel plate pairs provides reduced inductance in this module, for the reasons hereinbefore explained. Correspondingly, finger pairs 34a–36a, 34b–36b, etc. are also closely spaced and parallel at least in one plane. This too helps reduce module inductance. The center terminals 34, 36/74 and 76 are in a straight line between the finger tips, and parallel thereto. This provides easy terminal connections to a three conductor buss (not shown), and further provides for compact and uniform disposition of many modules but still easy and uniform connection to the three conductor buss. Accordingly, a further electrical uniformity is readily obtained.

Figure 8:
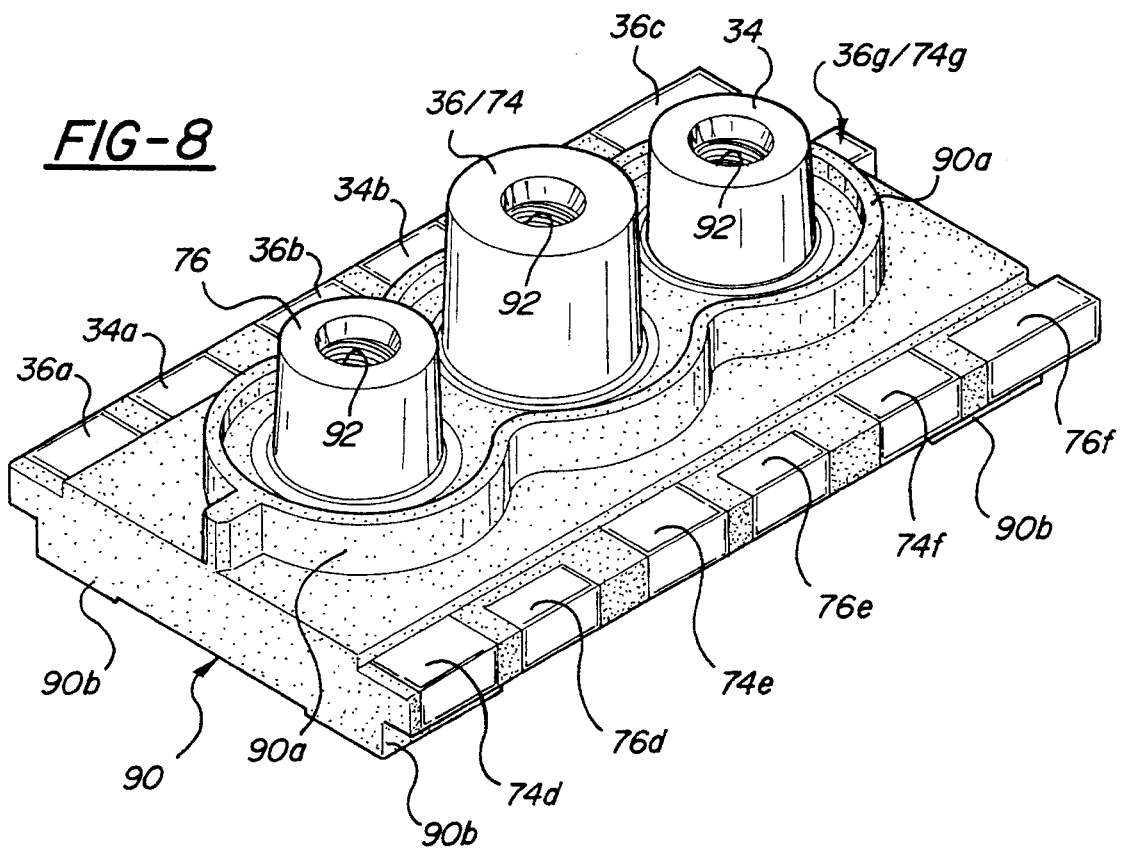
FIG. 8 shows the three terminal frame members of FIGS. 6–7 but after molding into a premolded terminal subassembly.

The close parallel disposition of frame members E1/C2, C1 and E2 can be maintained in a variety of ways. We believe it is best to mold them, in the above-mentioned closely spaced disposition, in an electrically non-conductive plastic matrix. This forms a unitary composite terminal subassembly 90, which is shown in FIG. 8. If desired, electrically non-conductive plastic sheets can be used between the upper and lower frame members during molding of the plastic matrix, to maintain close but predetermined vertical spacing between the frame members. The plastic sheets can include conformations that also maintain predetermined close lateral spacing, as between the finger tips. The finger tips of the frame members, frame member extension 36g/74g, and the shoulders at the bases of the terminal lugs can be clamped against mold surfaces during the molding. In this way, the finger tips, the extension and the terminal lugs will not be covered with plastic when plastic is injected into the mold to form the unitary terminal body 90. The result is the composite terminal subassembly 90 shown in FIG. 8. Composite terminal subassembly 90 includes additional conformations 90a on its surface for supplementary functions, as for example location and/or cooperation with the inner surface of a module cover member 116. It should also be noticed that extension 36g/74g was not covered with plastic either, to leave it available for Kelvin connection in the module.

As indicated above, FIG. 8 shows the three terminal frame members of FIGS. 6–7 after molding into a premolded terminal subassembly 90. The premolded terminal assembly thus forms a unitary part that has to be assembled into the module. This allows pretesting of another part of the module before actually incorporating it into the module, simplifies module assembly, and increases module yields. In addition, as indicated above, the two lines of coplanar terminals areas 34a/36a, etc. and 74a/76a, etc. provide still another manufacturing simplicity. Terminal tabs 14a and 15a of all the substrates can be concurrently positioned adjacent to these terminal areas and bonded to them in a single operation. We prefer electron or laser beam welding in a single welding operation, over soldering. Such a technique is described and claimed in the above-mentioned U.S. patent application Ser. No. 08/233,572. Our composite terminal subassembly is not only easily moldable but easily tested, easily assembled into a module and easily electrically connected to components therein. It provides a complex function in a simple unitary product. This simplicity not only enhances yields but also enhances reliability and durability, all of which is desirable for high volume commercial manufacturing.

Figure 9:
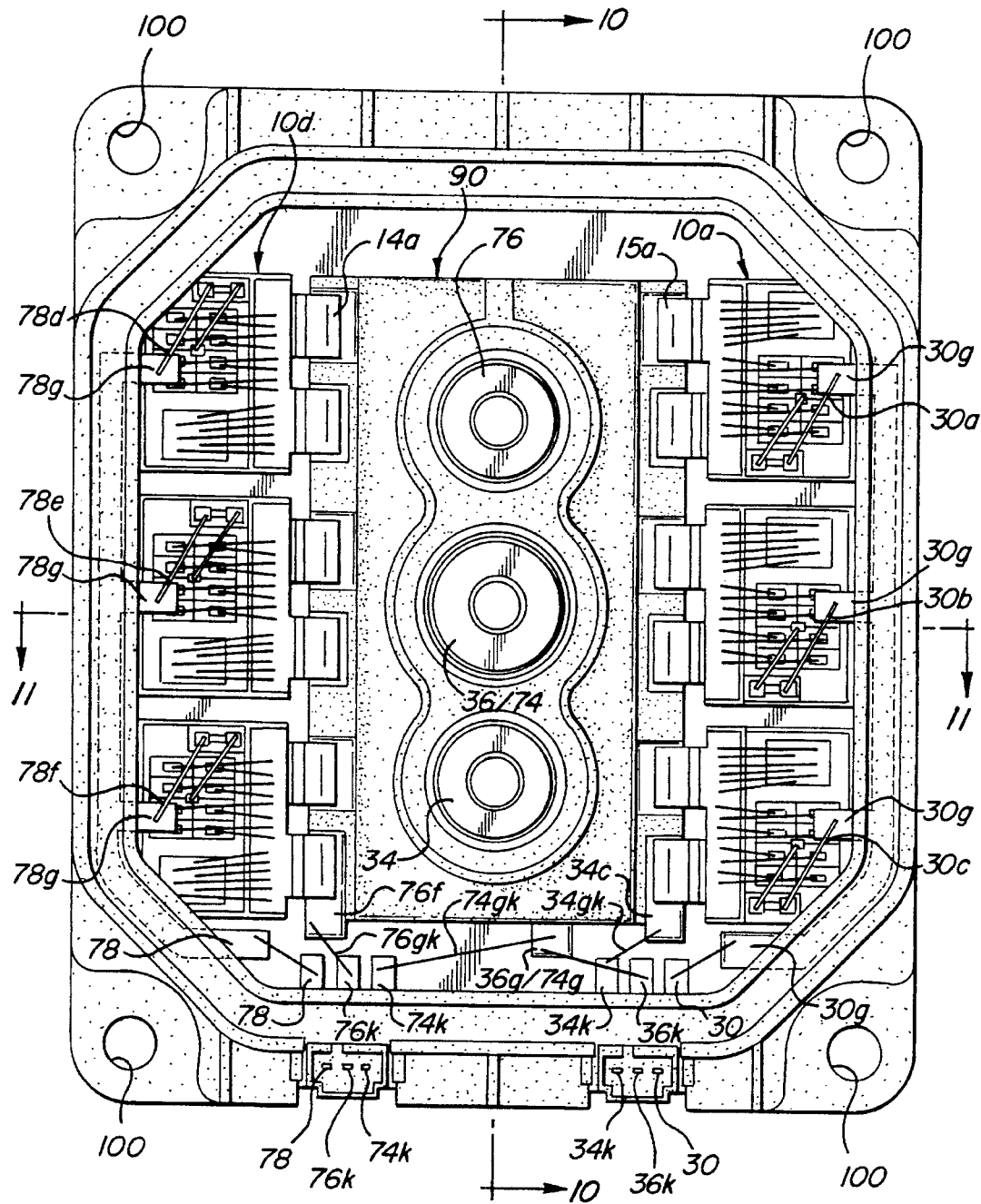
Figure 10:
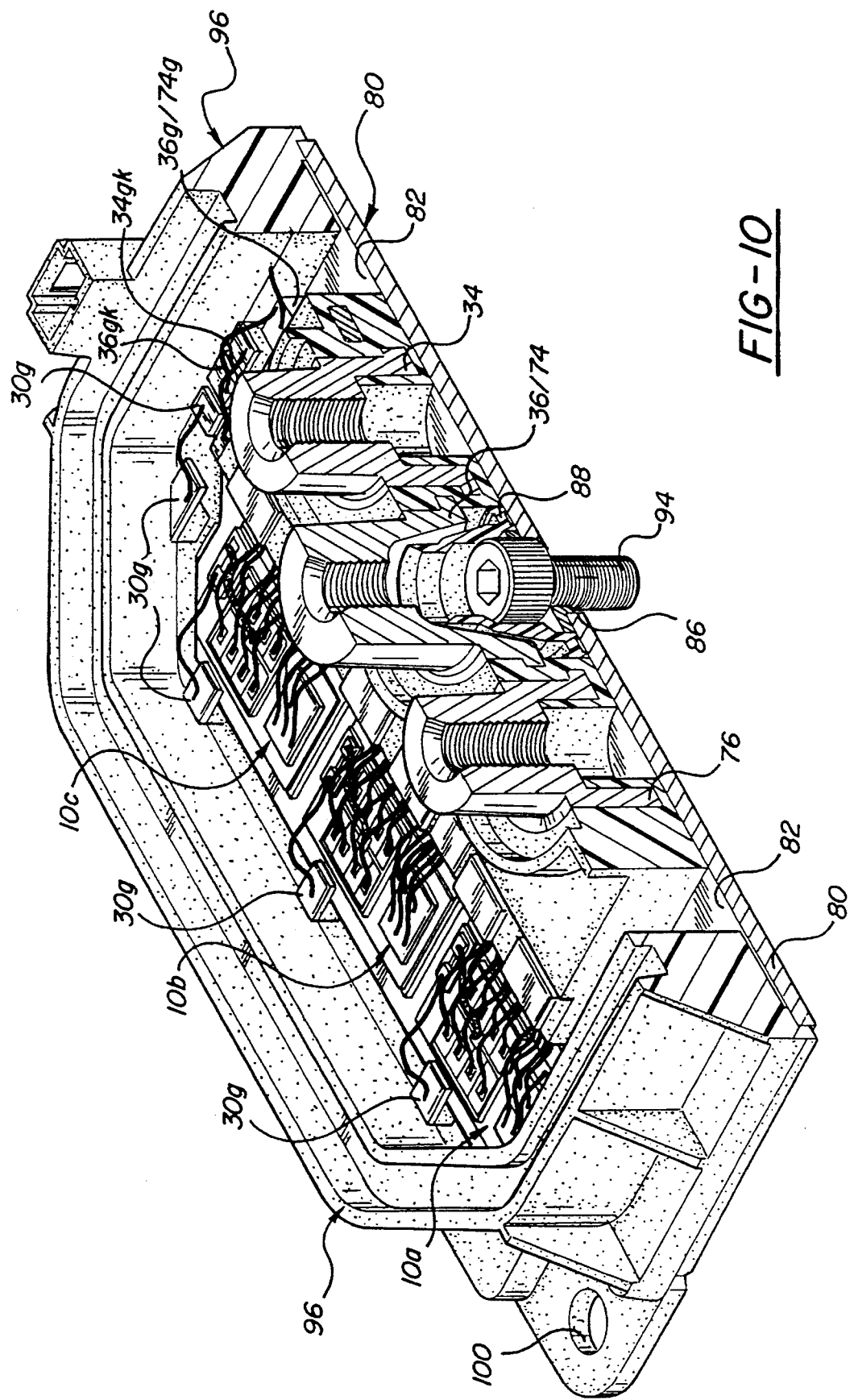
FIG. 10 shows a sectional view in perspective, with the section being along the line 10—10 of FIG. 9.
Figure 11:
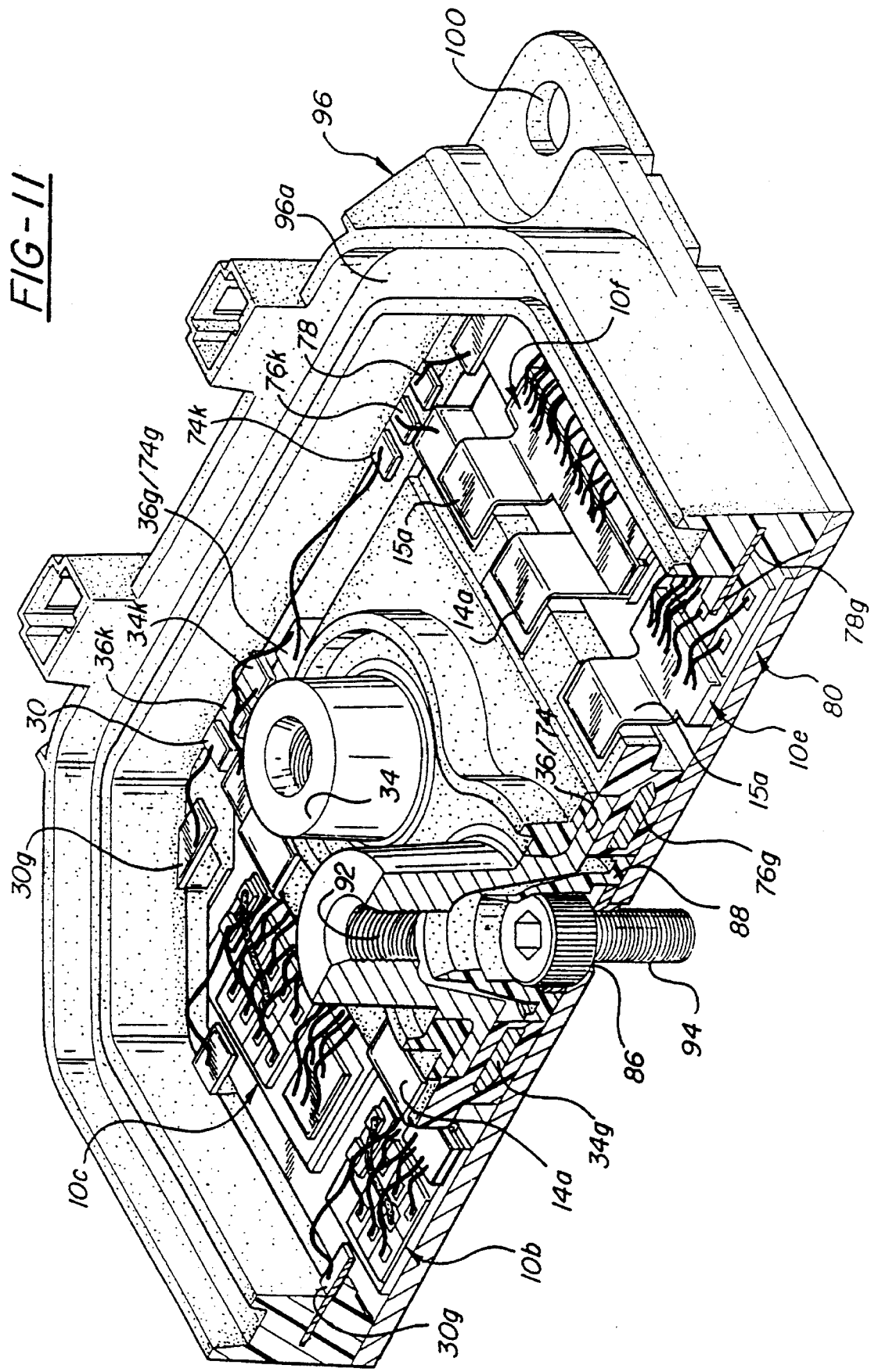
FIG. 11 shows a sectional view in perspective, with the section being along the line 11—11 of FIG. 9.

FIG. 9 shows a plan top view (with cover removed) of a linear type dual switch module. It has the premolded terminal subassembly 90 of FIG. 8 centrally disposed on a rectangular module baseplate 80. The length of the premolded terminal subassembly 90 is along the length of the baseplate 80 and parallel to its long sides. The Group I substrate subassemblies 10a, 10b and 10c are very symmetrically disposed in a parallel line along the right edge of terminal subassembly 90 in FIG. 9. The Group II substrate subassemblies 10d, 10e and 10f are analogously symmetrically disposed in a parallel line along the left edge of terminal subassembly 90 in FIG. 9. The symmetry is as described in the earlier U.S. Pat. No. 5,444,295, which description is incorporated herein by reference.

For completeness of disclosure herein, it is mentioned that the substrate subassemblies 10a–10f are initially bonded to baseplate 80 with terminal tabs 14a and 15a bent straight up. This permits easy contact for full power testing prior to further assembly of the module, as described in earlier patent applications referred to above. Once a pretested and acceptable baseplate/substrate subassembly combination has been formed, the pretested and acceptable terminal subassembly 90 is added to the baseplate. It is disposed on baseplate 80 in alignment with, and with its contacts parallel to, the two rows of substrate subassemblies. It is adhesively bonded to the baseplate 80 with a flexible adhesive such as a silicone adhesive Dow #6611. After the terminal subassembly 90 is bonded in place the terminal tabs 14a and 15a are "wiped" over their respective contact areas on terminal subassembly 90, to bend them in place for bonding. "Wiping" the thin terminal tabs may be all that is necessary to properly position the thin tabs for bonding. If not a fixture can be used to hold them in place for bonding. If they are to be bonded by laser or electron beam bonding in accordance with the afore-mentioned U.S. patent application Ser. No. 08/233, 572, the fixture can simply be a flat plate with an opening over the central portion of each tab. This means it has two parallel rows of openings. It would also have to have openings, or a conformation, to accommodate the terminal lugs on terminal subassembly 90. Also, the plate would cover the substrate subassemblies, to protect them from welding flash.

Baseplate 80 is a rectangular plate about 2–4 millimeters thick. It is preferably of a highly thermally conductive material that has a thermal expansion coefficient approaching that of silicon. One might think that metal would be preferred as a baseplate 80, because of its high thermal conductivity. However, most high thermal conductivity metals also have a relatively high coefficient of expansion. Silicon has a relatively low coefficient of expansion. Large differences in the coefficient of expansion are objectionable.

The known metals having a thermal expansion coefficient close to silicon, such as fernico, Kovar, Invar and the like, also have relatively low thermal conductivity. Accordingly, we prefer to use laminated, or other types, of composite materials for baseplate 80. They are more desirable for this application because they are designed to have good thermal expansion matching to silicon, and relatively high thermal transfer properties. The most attractive of such composites for our application are metal/ceramic composites. Since they include metal, they are generally electrically conductive, which we believe is a strong asset in our subject application. Such a composite baseplate offers significant benefits to the subject invention, even though the silicon chips are disposed on discrete ceramic substrates, as hereinafter described. We have found a metal/ceramic composite that can be quite effectively used in our application. It not only can be made to have high thermal conductivity but also relatively low in its rate of expansion. We prefer to use a composite material that has a coefficient of expansion somewhat close to that of silicon. More precisely, however, we want the composite baseplate 80 to closely match the coefficient of expansion of the composite ceramic substrate subassembly 10 on which the silicon chip is directly supported. We want the substrate subassembly to be quite similar to silicon but recognize the it may not be an exact, precise match. If the substrate subassembly coefficient of expansion does not exactly match that of silicon, that we prefer that the thermal expansion coefficient of the baseplate 80 match that of the substrate subassembly, not the silicon. As indicated, we prefer that the substrate be electrically conductive and solderable. Many metal/composites are commercially and experimentally available. If not inherently solderable, they should be treated to make them solderable, at least in the areas where the substrate subassemblies are to be mounted. This enhances thermal conduction between the substrate subassemblies 10 and the baseplate 80.

When a substrate subassembly 10 is soldered to a larger conductive support, the effective area of the substrate's lower copper plate 16 is increased. This enlarges parasitic capacitance. In turn, if the larger conductive support is supported directly on a still larger area aluminum heat sink member, parasitic capacitance increases even more. Using dielectric materials to space these items apart, is usually not desirable because it usually reduces thermal transfer. Hence, increased dielectric thickness is usually not considered desirable.

We have found one metal/ceramic composite that is particularly effective when used as baseplate 80. It is sold under the designation MCX-693 by the Lanxide Corporation of Newark Del. It has a coefficient of expansion of about 5–12 ppm per degree centigrade. We prefer 6 ppm per degree centigrade, which almost exactly the same as that of the Cu/BeO/Cu sandwich we use in substrate subassembly 10. This is close to that of silicon, which is about 3.2 ppm per degree centigrade. The MCX-693 material is essentially a combination of metal and ceramic in which the metal retains its identity sufficiently to provide high thermal conductivity. The ceramic retains its identity sufficiently to lower expansion coefficient but not thermal conductivity. We have found that the MCX-693 composite material additionally has fairly good mechanical strength. Thus it can serve as the baseplate itself, not as a support for it, which eliminates an additional thermal transfer interface. It forms a rugged module assembly. Further, it can be coated or plated to make its surface solderable.

Still further, the MCX-693 material has sufficient strength to allow it to be made as a hollow body. This allows the baseplate 80, itself, to also function as a cooling member. In such instance, baseplate 80 need not be mounted on a heatsink for cooling. It need only be mounted on a mechanical support analogous to what might be used for supporting the heatsink. This not only eliminates costs due to an additional member in the resulting system but eliminates a heat transfer interface. Eliminating a heat transfer interface, and its inherent losses, improves cooling. Improved cooling, in turn, allows the switching transistors to be operated at higher power levels.

The Group I substrate subassembly terminal tabs 14a are soldered or welded to the upper surface of finger tips 34a, 34b and 34c. The Group I substrate subassembly terminal tabs 15a are soldered or welded to the upper surface of finger tips 36a, 36b and 36c. The Group II substrate subassembly terminal tabs 14a are soldered or welded to the upper surface of finger tips 74d, 74e and 74f. The Group II substrate subassembly terminal tabs 15a are soldered or welded to the upper surface of finger tips 76d, 76e and 76f.

An annular nonconductive plastic housing member 96 is adhesively bonded to baseplate 80 surrounding the substrate subassemblies and the terminal subassembly. The adhesive can be a silicone adhesive of the type typically used in the semiconductor industry for such purposes.

Housing member 96 includes a number of embedded metal connector elements. They include a Group I embedded gate frame 30g and embedded gate frame 78g. As can be seen, these frames have portions exposed adjacent their respective substrate subassemblies, where they connect to the resistive elements on the substrate subassemblies by filamentary wires designated by reference numerals 30a–30c and 78d–78f.

Housing 96 also contains three embedded terminal members for each of Groups I and II. The Group I terminal members are indicated by reference numerals 34k, 36k, and 30. The Group II terminal members are indicated by reference numerals 74k, 76k, and 78. As can be seen, these terminal members are each exposed at their opposite ends, with one end being inside the housing and the other outside the housing. The inside ends are connected to their appropriate contact points inside the housing by filamentary wires. Terminal 34k is connected to terminal subassembly contact area 34c. Terminal 36k is connected to terminal subassembly contact area 36g/74g, as is terminal 74k. Terminal 76k is connected to terminal subassembly contact area 76f. Terminal 30 is connected to an exposed part of embedded lead frame member 30g. Terminal 78 is connected to an exposed part oaf embedded lead frame member 78g.

Baseplate 80 also has holes 100 for mounting the baseplate on a heatsink (not shown) or other support. As seen better in FIGS. 10 and 11, baseplate 80 also has a center hole 86, a washer located in the hole and a cylindrical plastic member 88 bonded to baseplate 80 over the washer. If desired, a spring washer (not shown) can be used under the head of each mounting bolt. Spring washers help maintain a constant pressure between the baseplate 80 and its support during thermal cycling, without inducing too much mechanical stress between them. The hole 86, washer and plastic member 88 are all disposed under the center terminal 36/74. The head of bolt 94 is trapped within the cylindrical plastic member 88. Cylindrical plastic member 88 has a reduced diameter upper portion slightly smaller than the diameter of the head of bolt 94. For shipping, the head of bolt 94 is pressed up into the upper portion of cylindrical plastic member 88, and frictionally held in place. Terminal 36/74 has bore 92 that provides access to the head of bolt 94. When the module is ready for mount, an allen wrench can be placed in bore 92. The allen wrench can initially be used to push bolt 94 out of engagement with plastic member 88 and out through hole 86. It can then be used to push bolt 94 into engagement with a threaded hole in a support, and then tighten it there.

Figure 12:
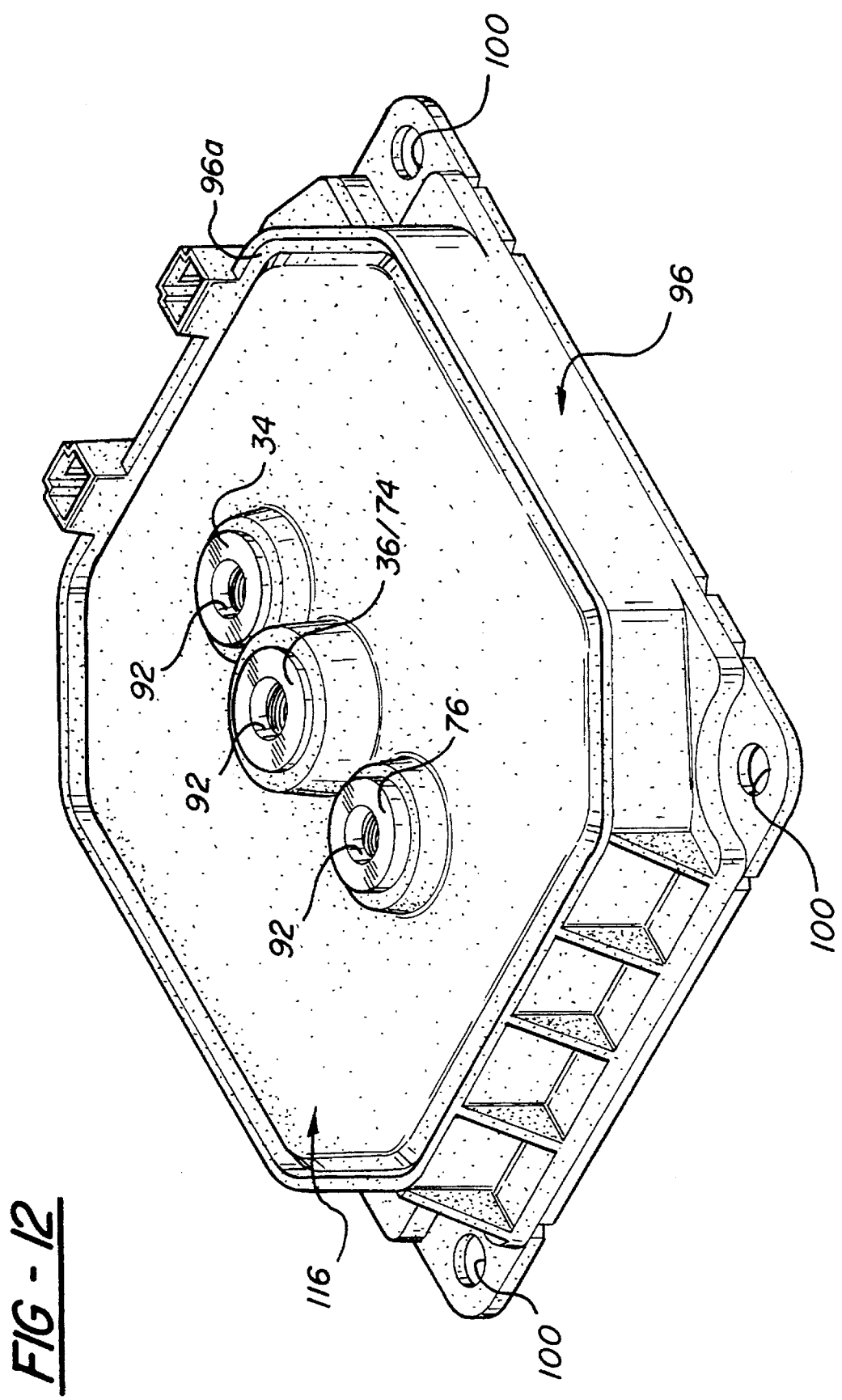

Housing 96 has a cover 116. Cover 116 has a circumferential lower lip (not shown) on its periphery that cooperates with a continuous circumferential channel 96a in the upper surface of housing 96. Channel 96a is filled with silicone adhesive, to bond cover 116 to housing 96. As seen in FIG. 12, cover 116 has openings through which terminal lugs 34, 36/74 and 76 project. Any plastic suitable for semiconductor applications can be used for the composite terminal subassembly 90, the housing 96 and the cover 116. The lead frames in composite terminal subassembly 90 are preferably nickel plated copper, as are the embedded members in housing 96. However, any metal or laminate can be used that provides an adequate low electrical resistance and a surface suitable for the type of bonding that is used for the various connections. The chip resistors 32a–32f can be initially selected to provide similar operation among all substrate subassemblies. However, if they end up not being similar in final assembly, they can be trimmed before cover 116 is placed on the module housing. They could even be trimmed to be selectively different, for some special application.

After final assembly is substantially completed, but cover 116 not yet put in place, the housing 96 is preferably filled with a silicone resin or oil to passivate it. The resin also provides some mechanical protection. The filling is not shown because it is optional, and well known. Moreover, showing it would tend to obscure the new and different important features of the invention. Cover 116 can have apertures (not shown) to fill, or complete filling, of the housing 96 after the cover 116 is installed.

It is recognized that this invention has been described in connection with certain specific embodiments. On the other hand, it is understood that the basic principles of this invention can take the form of many other embodiments without departing from the spirit of this invention. It is intended that the claims not be limited to the precise embodiments herein disclosed, but only limited as expressly recited in the claims hereof.

We claim:

1. A semiconductor switching device module of reduced inductance adapted for commercial manufacture comprising:

a module housing having a baseplate;

a first terminal plate having opposed major faces and a contoured edge having spaced mutually aligned contact areas;

a second terminal plate disposed on said baseplate, said second terminal plate member having opposed major faces and a contoured edge having spaced mutually aligned contact areas extending out of the plane of said second terminal plate;

said first terminal plate being disposed in relation to said second terminal plate such that facing major faces of said first and second terminal plates are generally parallel to one another and disposed in generally overlapping relationship, but with said edges in non-overlapping lateral alignment and providing at least one pair of adjacent coplanar contact areas from said first and second terminal plates;

at least one insulated gate semiconductor switching device disposed on said baseplate in close proximity to said pair of contact areas; and means for respectively interconnecting said pair of adjacent contact areas to input and output regions of said semiconductor switching device, whereby input current to and output current from said semiconductor switching device can pass through said contact areas and said terminal plates in opposite directions and provide reduced net inductance in said module.

2. The semiconductor switching device module as defined in claim 1 wherein the semiconductor switching device is an insulated gate bipolar transistor and the terminal plates are embedded in an electrically nonconductive material, effective to produce a unitary composite terminal subassembly.

3. The semiconductor switching device module as defined in claim 2 wherein the terminal plate contact areas of each terminal plate form a row of contact areas on the edge of each terminal plate, the contact areas are on fingers extending from the respective edges of the terminal plates, the fingers of the respective plate edges are interdigitated to form a combined row of contact areas in which contact areas of the respective terminal plates alternate, a plurality of semiconductor switching devices are disposed on said baseplate in a symmetrical row parallel to and adjacent to said row of contact areas, and means for interconnecting adjacent pairs of said contact areas to given semiconductor switching devices in said row of switching devices.

4. The semiconductor switching device module as defined in claim 1 wherein said first terminal plate has two edges that form two parallel rows of contact areas, the second terminal plate is narrower than the first terminal plate, a third terminal plate is disposed on said baseplate, the third terminal plate has opposed major faces and is narrower than the first terminal plate, the third terminal plate has a contoured edge having spaced mutually aligned contact areas forming a row of contact areas, said second and third terminal plates are disposed in the same plane such that each of the second and third terminal plates substantially overlaps the first terminal member, allowing the rows of contact areas on the second and third terminal plates to interdigitate with the contact areas on the first terminal plate.

5. The semiconductor switching device module as defined in claim 4 wherein each semiconductor switching device is disposed on its own separate substrate, the substrates are symmetrically arrayed in rows adjacent and parallel to the contact area rows, individual contact areas are fingers on the edges of the terminal plates, and the fingers are symmetrically arranged with respect to the substrates.

6. The semiconductor switching device module as defined in claim 5 wherein the terminal plates are embedded within plastic, effective to form a terminal frame subassembly, and the terminal frame subassembly is bonded to the baseplate of the module housing.

7. The semiconductor switching device module as defined in claim 4 wherein the impedance of the second and third terminal plates is about equal and their combined impedance is about equal to the impedance of the first terminal member.

8. The semiconductor switching device module as defined in claim 4 wherein each of the terminal plates have an integral upstanding terminal lug thereon, the first terminal plate has conformations to accommodate the terminal lugs of the first and second terminal plates, and the terminal plates are embedded in an electrically nonconductive material that does not cover said terminal lugs or contact areas, effective to form a unitary composite terminal subassembly.

9. The semiconductor switching device module as defined in claim 8 wherein the housing contains embedded lead frame portions for Kelvin connections to said terminal subassembly and for gate connections to said semiconductor devices.

10. A terminal plate combination for a semiconductor power module comprising:

a first terminal plate having aligned and coplanar contact areas along at least one edge;

portions of said first terminal plate removed at said edge between said aligned and coplanar contact areas, to form openings between said aligned and coplanar contact areas at said edge;

a second terminal plate having aligned and coplanar contact areas along an edge thereof;

portions of said second terminal plate removed at said edge between said aligned and coplanar contact areas, to form openings between said aligned and coplanar contact areas at said edge complementarily to the openings formed between the contact areas on the first terminal plate;

the aligned and coplanar contact areas on at least one of said terminal plates disposed out of the plane of such terminal plate;

said first and second terminal plates being disposed adjacent in parallel relationship, with the contact areas of one terminal plate disposed between but spaced from the contact areas of the other terminal plate, so as to form a coplanar line of such contact areas; and other portions of each of said plates having major surfaces closely spaced and parallel to one another, so as to allow current flow in opposite directions in such other portions;

effective to form a low inductance terminal frame combination for a semiconductor switching device.

11. The terminal plate combination as described in claim 10 wherein the first and second terminal plates are embedded within a matrix of electrically nonconductive material, effective to form a terminal frame subassembly.

12. The terminal plate combination as described in claim 11 wherein the nonconductive material is injection molded plastic.

13. The terminal plate combination as described in claim 10 wherein each of the terminal members have an integral upstanding terminal lug thereon, and one of the terminal plates has a conformation to accommodate the terminal lug of the other terminal plate.

14. A terminal plate subassembly for a semiconductor dual switch power module comprising:

a first terminal plate having aligned and coplanar contact areas along each of two parallel edges, so as to form first and second parallel lines of contact areas thereon;

portions of said first terminal plate removed at each of its edges between said aligned and coplanar contact areas, so as to form openings between said aligned and coplanar contact areas at each said edge;

a second terminal plate having aligned and coplanar contact areas along an edge thereof, said second terminal plate being narrower than the first terminal plate;

portions of said second plate removed at its edge between said aligned and coplanar contact areas, so as to form openings between said aligned and coplanar contact areas at said edge complementarily to the openings formed between the contact areas of said first line of contact areas on the first terminal plate;

a third terminal plate having aligned and coplanar contact areas along an edge thereof, said third terminal plate being narrower than the first terminal plate;

portions of said third plate removed at its edge between said aligned and coplanar contact areas, so as to form openings between said aligned and coplanar contact areas at said edge complementarily to the openings formed between the contact areas of said second line of contact areas on the first terminal plate;

the aligned and coplanar contact areas on at least one of said first terminal plate and said second terminal plate being disposed out of the plane of the terminal plate;

the aligned and coplanar contact areas on at least one of said first terminal plate and said third terminal plate being disposed out of the plane of the terminal plate;

said first and second terminal plates being disposed adjacent in parallel relationship, and also said first and third terminal plates being disposed adjacent in parallel relationship, so as to form two terminal plate pairs, with the contact areas of the terminal plates in each pair disposed between but spaced from the contact areas of the other terminal plate in the pair, so as to form two coplanar and parallel lines of such contact areas;

other portions of each of said terminal plate pairs having major surfaces adjacent and parallel to one another, so as to allow adjacent current flow in opposite directions in such other portions; and said terminal plates embedded in a matrix of electrically nonconductive material that leaves said contact areas exposed, effective to form a unitary and pretestable low inductance terminal frame subassembly for a high power semiconductor switching module.

15. The terminal plate subassembly as described in claim 14 wherein the second and third terminal plates are coplanar, have facing edges in such plane, the combined other portions of said second and third terminal plates generally corresponding in area to the other portion of said first terminal plate, effective to provide substantial overlap between said other portions of said terminal plates.

16. The terminal plate subassembly as described in claim 14 wherein the other portions of the terminal plates have substantially similar impedance, and the terminal plates have terminal lugs thereon.

17. The terminal plate subassembly as described in claim 14 wherein the edges of the second and third terminal plates are bent but not the first terminal plate, so that when assembled with the first terminal plate, the contact areas on the edges of all three terminal plates are coplanar.

18. The terminal plate subassembly as described in claim 14 wherein the terminal plates are spaced by a preformed plastic sheet, which is also embedded within the matrix of electrically nonconductive material.

* * * * *